United States Patent
Mochizuki et al.

(10) Patent No.: US 11,145,555 B2
(45) Date of Patent: Oct. 12, 2021

(54) GATE-LAST PROCESS FOR VERTICAL TRANSPORT FIELD-EFFECT TRANSISTOR

(71) Applicant: International Business Machines Corporation, Armonk, NY (US)

(72) Inventors: Shogo Mochizuki, Clifton Park, NY (US); ChoongHyun Lee, Rensselaer, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/824,801

(22) Filed: Mar. 20, 2020

(65) Prior Publication Data
US 2020/0219777 A1 Jul. 9, 2020

Related U.S. Application Data

(62) Division of application No. 16/106,412, filed on Aug. 21, 2018, now Pat. No. 10,714,399.

(51) Int. Cl.
*H01L 29/78* (2006.01)
*H01L 29/66* (2006.01)
(Continued)

(52) U.S. Cl.
CPC ........... *H01L 21/823885* (2013.01); *H01L 21/02636* (2013.01); *H01L 21/26513* (2013.01);
(Continued)

(58) Field of Classification Search
CPC ........... H01L 29/7827; H01L 29/42376; H01L 29/66545; H01L 27/092; H01L 21/823885
See application file for complete search history.

(56) References Cited

U.S. PATENT DOCUMENTS 6,770,534 B2  8/2004  Cho et al.
6,773,994 B2  8/2004  Chittipeddi et al.
(Continued)

FOREIGN PATENT DOCUMENTS

CN            103972067 A   1/2014
CN            105261645 A   7/2014
WO  PCT/IB2018/060735  5/2019

OTHER PUBLICATIONS

S. Yamaguchi et al., "Effective Work-Function Control Technique Applicable to p-Type FinFET High-k/Metal Gate Devices," Microelectronics Reliability, May 2017, pp. 80-84, vol. 72.
(Continued)

*Primary Examiner* — Mark W Tornow
(74) *Attorney, Agent, or Firm* — Randall Bluestone; Ryan, Mason & Lewis, LLP

(57) ABSTRACT

A method of forming a semiconductor structure includes forming a plurality of fins over a top surface of a substrate, and forming one or more vertical transport field-effect transistors from the plurality of fins, the plurality of fins providing channels for the one or more vertical transport field-effect transistors. The method also includes forming a gate stack for the one or more vertical transport field-effect transistors surrounding at least a portion of the plurality of fins, the gate stack including a gate dielectric formed over the plurality of fins, a work function metal layer formed over the gate dielectric, and a gate conductor formed over the work function metal layer. The gate stack comprises a box profile in an area between at least two adjacent ones of the plurality of fins.

20 Claims, 20 Drawing Sheets

(51) Int. Cl.
*H01L 29/08* (2006.01)
*H01L 29/49* (2006.01)
*H01L 21/8238* (2006.01)
*H01L 21/28* (2006.01)
*H01L 21/02* (2006.01)
*H01L 21/265* (2006.01)
*H01L 27/092* (2006.01)
*H01L 21/324* (2006.01)

(52) U.S. Cl.
CPC ...... *H01L 21/28088* (2013.01); *H01L 21/324* (2013.01); *H01L 21/823814* (2013.01); *H01L 21/823842* (2013.01); *H01L 27/092* (2013.01); *H01L 29/0847* (2013.01); *H01L 29/4966* (2013.01); *H01L 29/66545* (2013.01); *H01L 29/66553* (2013.01); *H01L 29/66666* (2013.01); *H01L 29/7827* (2013.01)

(56) References Cited

U.S. PATENT DOCUMENTS

| | | | |
|---|---|---|---|
| 7,683,428 B2* | 3/2010 | Chidambarrao | H01L 29/66787 257/347 |
| 8,274,110 B2* | 9/2012 | Sandhu | H01L 27/2454 257/329 |
| 8,455,932 B2 | 6/2013 | Khakifirooz et al. | |
| 8,865,581 B2 | 10/2014 | Clark | |
| 8,877,575 B2 | 11/2014 | Fumitake | |
| 9,048,254 B2 | 6/2015 | Chen et al. | |
| 9,087,897 B1* | 7/2015 | Anderson | H01L 29/42392 |
| 9,136,178 B2 | 9/2015 | Li et al. | |
| 9,209,278 B2 | 12/2015 | Tang et al. | |
| 9,437,503 B1* | 9/2016 | Mallela | H01L 27/092 |
| 9,502,566 B2 | 11/2016 | Fenouillet-Beranger et al. | |
| 9,530,863 B1 | 12/2016 | Zhang et al. | |
| 9,530,866 B1 | 12/2016 | Zhang et al. | |
| 9,536,793 B1 | 1/2017 | Zhang et al. | |
| 9,613,868 B2 | 4/2017 | Yu | |
| 9,640,636 B1 | 5/2017 | Bentley et al. | |
| 9,653,465 B1 | 5/2017 | Balakrishnan et al. | |
| 9,773,708 B1 | 9/2017 | Zhang et al. | |
| 9,780,208 B1 | 10/2017 | Xie et al. | |
| 9,786,788 B1* | 10/2017 | Anderson | H01L 29/78642 |
| 9,799,751 B1 | 10/2017 | Zhang et al. | |
| 9,859,421 B1 | 1/2018 | Robison et al. | |
| 9,882,047 B2 | 1/2018 | Leobandung | |
| 9,911,738 B1 | 3/2018 | Niimi et al. | |
| 9,935,199 B2 | 4/2018 | Ching et al. | |
| 10,014,370 B1 | 7/2018 | Xie et al. | |
| 2006/0166429 A1 | 7/2006 | Chaudhry et al. | |
| 2006/0261406 A1 | 11/2006 | Chen | |
| 2016/0240626 A1* | 8/2016 | Chang | H01L 21/823807 |
| 2017/0025412 A1* | 1/2017 | Jun | H01L 21/823885 |
| 2017/0053913 A1 | 2/2017 | Min et al. | |
| 2017/0162446 A1 | 6/2017 | Balakrishnan et al. | |
| 2017/0179282 A1 | 6/2017 | Balakrishnan et al. | |
| 2017/0194155 A1* | 7/2017 | Anderson | H01L 23/535 |
| 2017/0288056 A1 | 10/2017 | Balakrishnan et al. | |
| 2018/0006118 A1 | 1/2018 | Mallela et al. | |
| 2018/0019337 A1 | 1/2018 | Xie et al. | |
| 2018/0053847 A1 | 2/2018 | Balakrishnan et al. | |
| 2019/0172830 A1* | 6/2019 | Ok | H01L 29/66666 |

OTHER PUBLICATIONS

A.P. Jacob et al., "Scaling Challenges for Advanced CMOS Devices," International Journal of High Speed Electronics and Systems, 2017, 76 pages, vol. 26, No. 1.

Disclosed Anonymously, "Method and Structure of Forming VFET Bottom Spacer and Replacement Gate," ip.com, ip.com No. IPCOM000250753D, Aug. 30, 2017, 9 pages.

List of IBM Patents or Patent Applications Treated as Related.

* cited by examiner

150

175

200

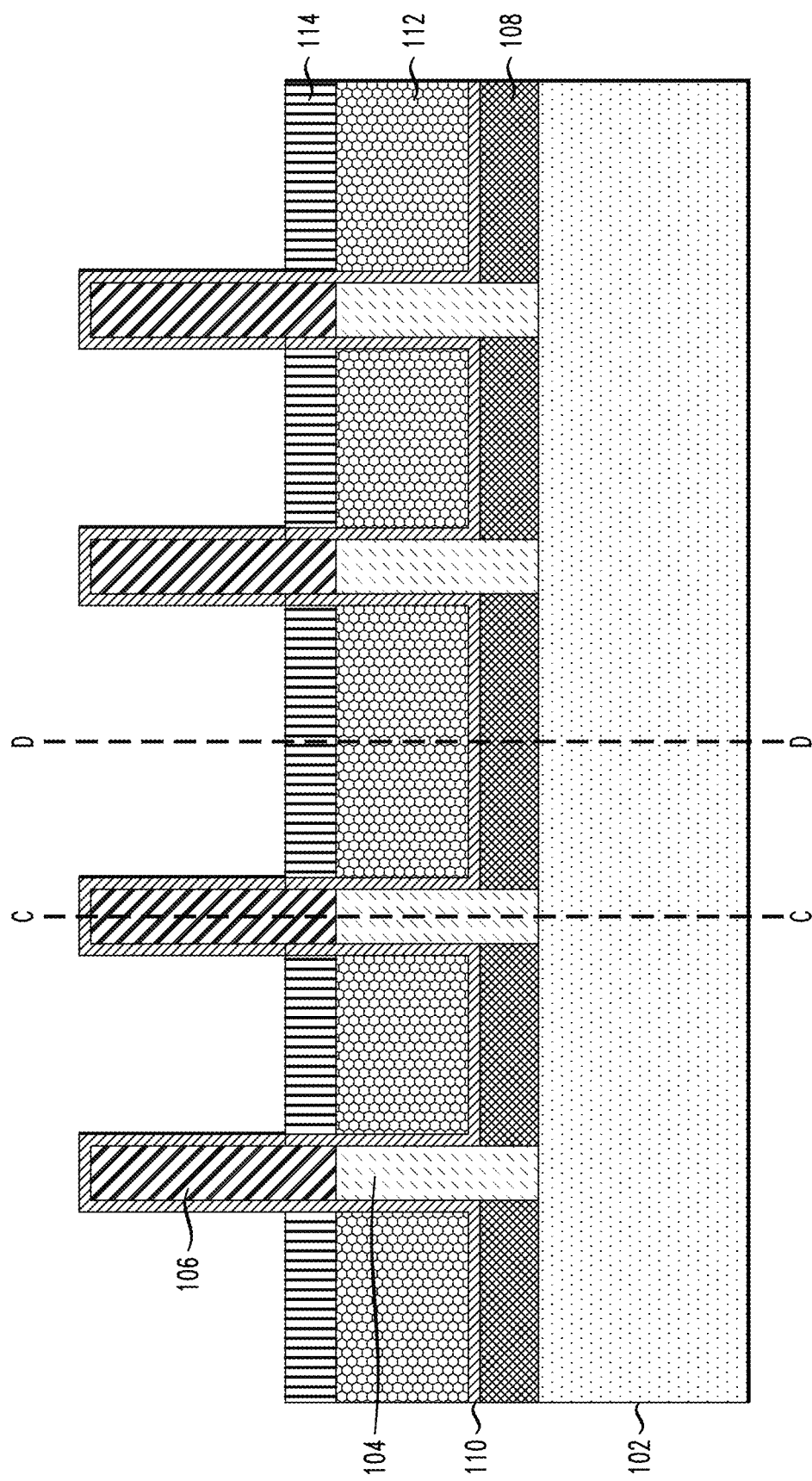

250

275

300

1100

1400

GATE-LAST PROCESS FOR VERTICAL TRANSPORT FIELD-EFFECT TRANSISTOR

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for gate-last processes for forming vertical transport field-effect transistors.

In one embodiment, a method of forming a semiconductor structure comprises forming a plurality of fins over a top surface of a substrate, and forming one or more vertical transport field-effect transistors from the plurality of fins, the plurality of fins comprising channels for the one or more vertical transport field-effect transistors. The method also comprises forming a gate stack for the one or more vertical transport field-effect transistors surrounding at least a portion of the plurality of fins, the gate stack comprising a gate dielectric formed over the plurality of fins, a work function metal layer formed over the gate dielectric, and a gate conductor formed over the work function metal layer. The gate stack comprises a box profile in an area between at least two adjacent ones of the plurality of fins.

In another embodiment, a semiconductor structure comprises a substrate, a plurality of fins disposed over a top surface of the substrate, the plurality of fins comprising channels for one or more vertical transport field-effect transistors, and a gate stack surrounding at least a portion of the plurality of fins, the gate stack comprising a gate dielectric disposed on the plurality of fins, a work function metal layer disposed on the gate dielectric, and a gate conductor disposed on the work function metal layer. The gate stack comprises a box profile in an area between at least two adjacent ones of the plurality of fins.

In another embodiment, an integrated circuit comprises one or more vertical transport field-effect transistors comprising a substrate, a plurality of fins disposed over a top surface of the substrate, the plurality of fins comprising channels for the one or more vertical transport field-effect transistors, and a gate stack surrounding at least a portion of the plurality of fins, the gate stack comprising a gate dielectric disposed on the plurality of fins, a work function metal layer disposed on the gate dielectric, and a gate conductor disposed on the work function metal layer. The gate stack comprises a box profile in an area between at least two adjacent ones of the plurality of fins.

BRIEF DESCRIPTION OF THE DRAWINGS

FIG. 2B depicts a first cross-sectional view of the FIG. 2A structure taken perpendicular to the fins, according to an embodiment of the invention.

DETAILED DESCRIPTION

Figure 1A:
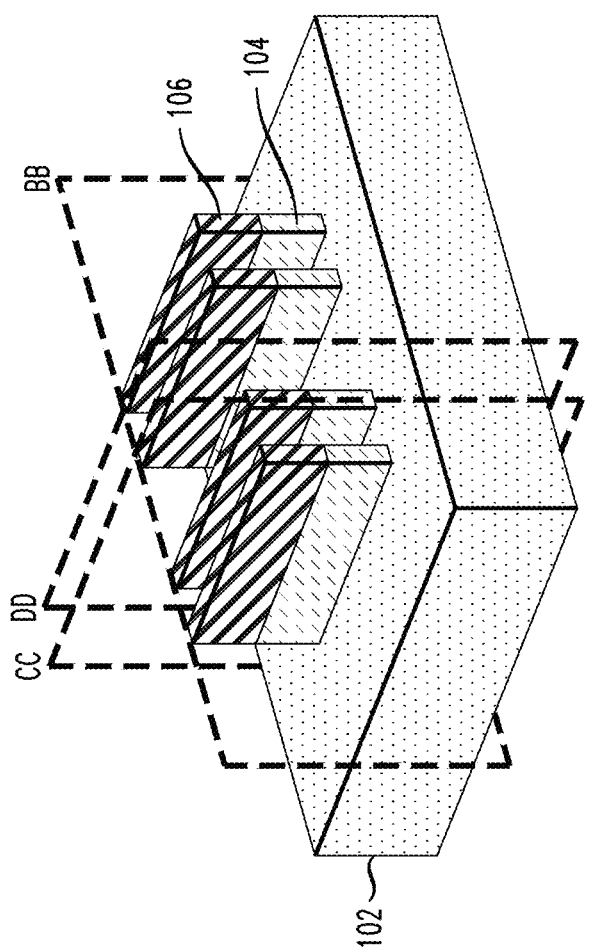
FIG. 1A depicts a perspective view of a set of fins disposed over a substrate, according to an embodiment of the invention.

Illustrative embodiments of the invention may be described herein in the context of illustrative methods for gate-last processes for vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. In gate first processes for forming VTFETs, there is a thermal budget restriction for formation of the top source/drain regions once the gate has been formed. This thermal budget restriction presents a number of challenges and difficulties, such as in getting top source/drain epitaxial growth with reasonable growth rates, getting top source/drain epitaxial growth with good selectivity, and achieving high dopant activation in the top source/drain without activation annealing. There is a need, therefore, for gate-last processes for scaling device structure with tight fin-to-fin spacing. Illustrative embodiments provide gate-last replacement metal gate (RMG) processes for forming VTFETs that overcome the above-noted difficulties.

In some embodiments, top source/drain formation and activation is performed prior to formation of the final gate stack, including the formation of the gate dielectric and gate conductor, where the gate conductor may include a work function metal disposed over the gate dielectric and a gate material disposed over the work function metal. The VTFET structure in some embodiments is formed using a dummy gate, such as a polysilicon (poly-Si) dummy gate. Some embodiments further provide for selective doped epitaxial growth of the top source/drain regions followed by activation anneal, which is not possible or made difficult in gate first processes due to the above-described thermal budget restrictions. In other embodiments, the top source/drain regions may be implanted with doped ions after epitaxial growth, which is then followed by activation anneal.

Vertical FET process flows have strict constraints on thermal budgets for downstream processing steps, such as top source/drain epitaxial growth and dopant activation anneal processes, because the high-k metal gate (HKMG) module is formed earlier in gate first processes.

Illustrative processes for forming VTFETs using gate-last processes will now be described with respect to FIGS. 1-14.

Figure 1B:
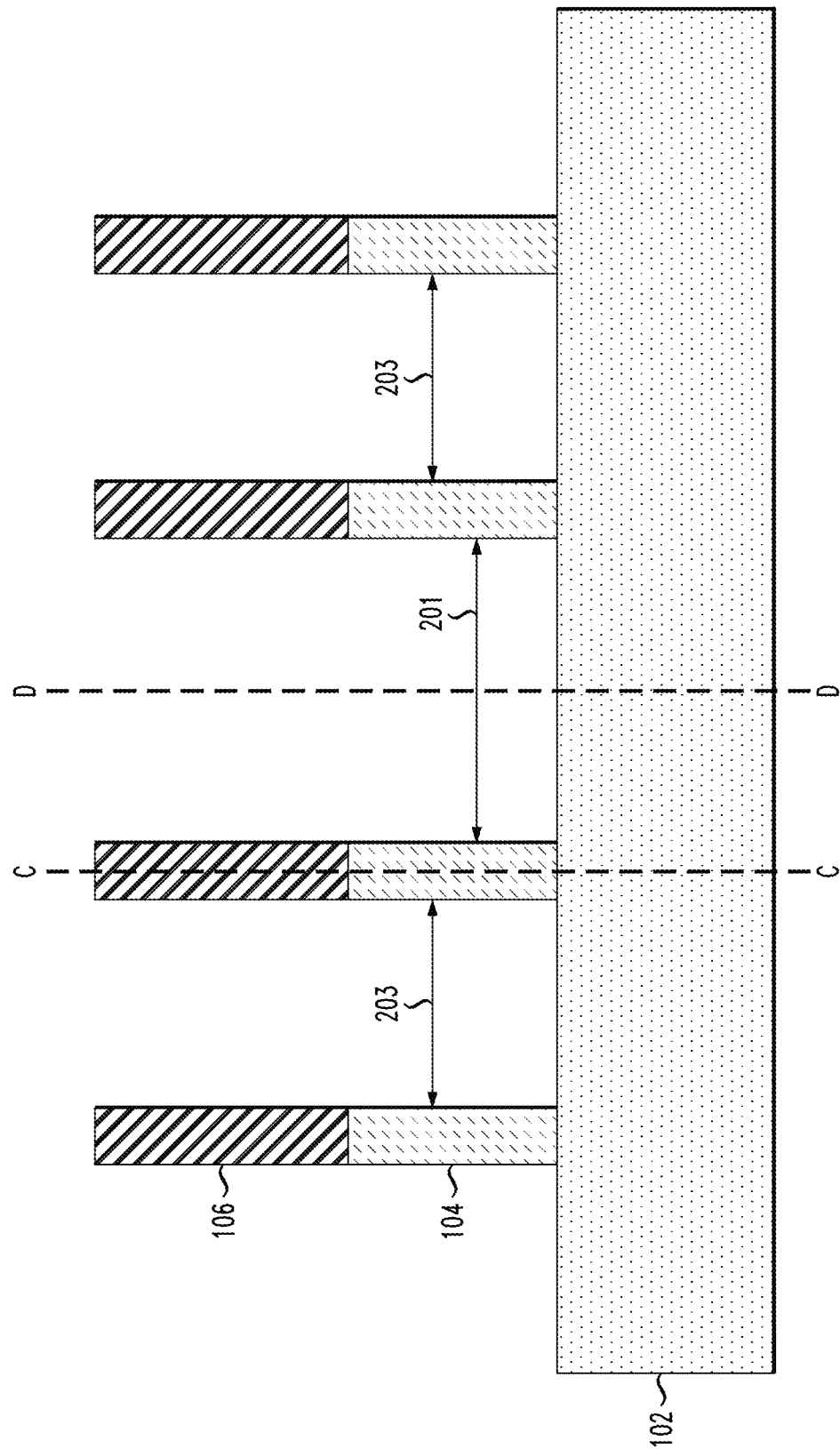
FIG. 1B depicts a first cross-sectional view of the FIG. 1A structure taken perpendicular to the fins, according to an embodiment of the invention.
Figure 1C:
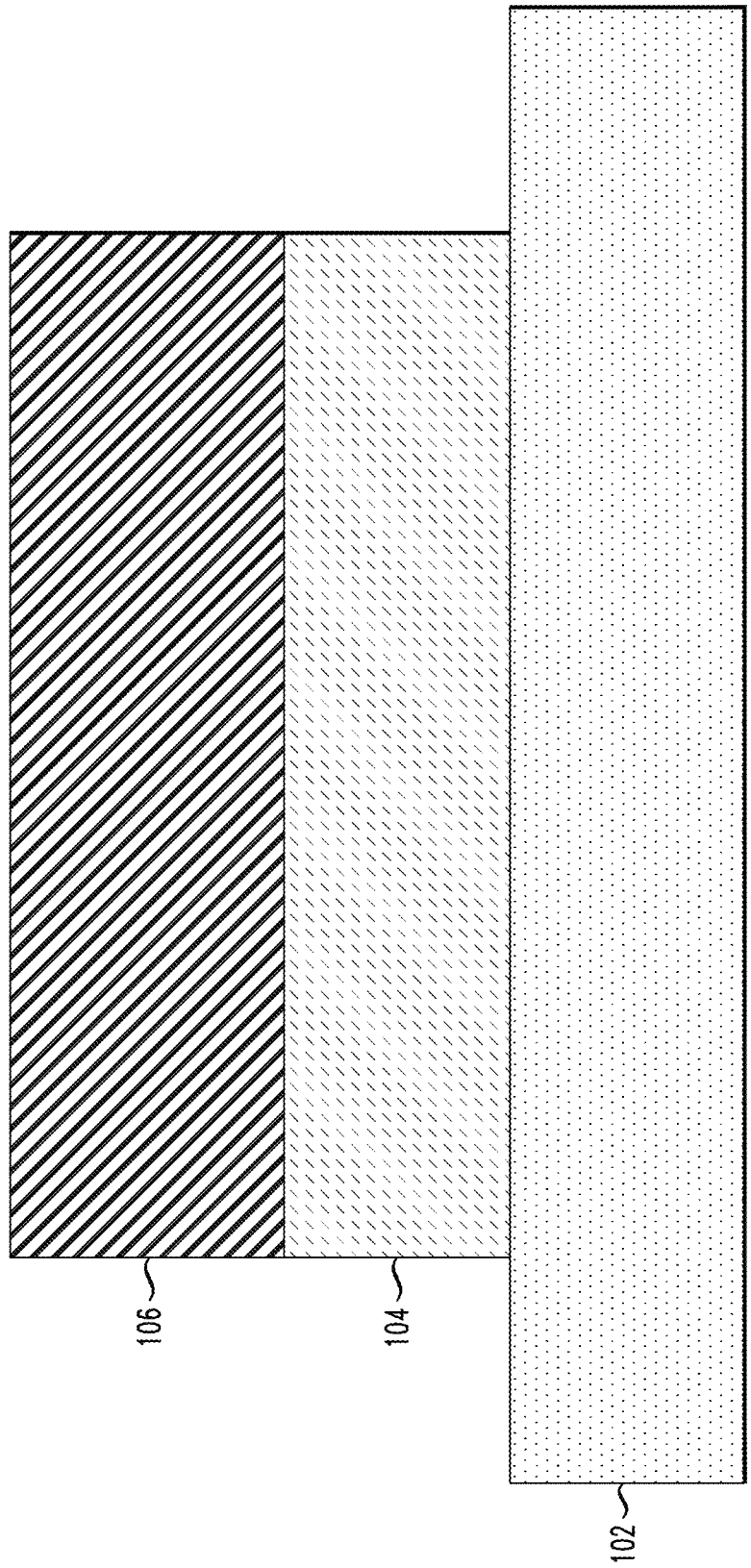
FIG. 1C depicts a second cross-sectional view of the FIG. 1A structure taken along one of the fins, according to an embodiment of the invention.
Figure 1D:
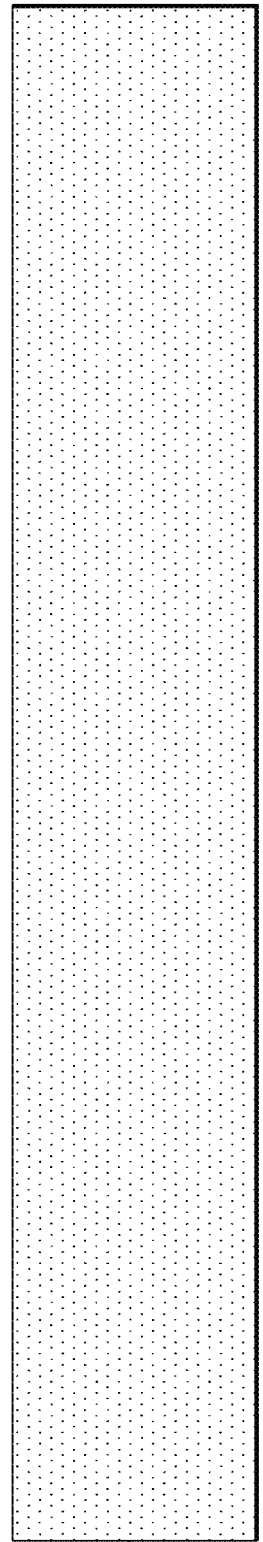
FIG. 1D depicts a third cross-sectional view of the FIG. 1A structure taken in an area between two of the fins, according to an embodiment of the invention.

FIG. 1A depicts a perspective view 100 of a semiconductor structure that includes a substrate 102, a set of fins 104 and hard masks 106 formed over the fins 104. FIG. 1B shows a first cross-sectional view 125 of the FIG. 1A structure, taken perpendicular to the fins 104 along the cross section BB shown in FIG. 1A. FIG. 1C shows a second cross-sectional view 150 of the FIG. 1A structure, taken along one of the fins 104 along the cross section CC shown in FIGS. 1A and 1B. FIG. 1D shows a third cross-sectional view 175 of the FIG. 1A structure, taken in a space between two of the fins 104 along the cross section DD shown in FIGS. 1A and 1B.

The substrate 102 may comprise a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The fins 104 are formed by patterning the substrate 102 as discussed above, and thus may be formed of the same material as the substrate 102.

The size of the substrate 102 may vary, such as based on the number of fins 104 or other features that will be formed thereon. The vertical thickness or height of the substrate 102 may be in the range of 10 nanometers (nm) to 200 nm, although other heights above or below this range may be used as desired for a particular application.

The fins 104 may be formed using sidewall image transfer (SIT) or other suitable techniques such as lithography and etching including reactive-ion etching (RIE), etc. The fins 104 may be formed of the same material as the substrate 102. Each of the fins 104 may have a width or horizontal thickness in the range of 5 nm to 20 nm, a length in the range of 5 nm to 100 nm, and a height in the range of 30 nm to 100 nm, although other widths, lengths and heights above or below these ranges may be used as desired for a particular application.

The hard masks 106 may be initially formed over a top surface of the entire substrate, followed by patterning using SIT or other suitable techniques, with the fins 104 being formed by etching portions of the substrate 102 exposed by the patterned hard mask 104 to arrive at the structure shown in FIG. 1A. The hard masks 106 may be formed of silicon nitride (SiN), although other suitable materials such as silicon oxide ($SiO_X$), silicon dioxide ($SiO_2$) and silicon oxynitride (SiON) may be used. The hard masks 106 may have widths and lengths that match that of the underlying fins 104. The hard masks 106 may have heights in the range of 10 nm to 100 nm, although other heights above or below this range may be used as desired for a particular application.

FIG. 1B shows a first cross-sectional view 125 of the FIG. 1A structure, taken perpendicular to the fins 104 along the cross section BB shown in FIG. 1A. A spacing between adjacent ones of the fins 104 may be in the range of 20 nm to 100 nm, although other spacing may be used as desired for a particular application. As shown in FIG. 1B, the spacing between the fins 104 may vary. In some cases, there may be an increased spacing between different sets of the fins 104. For example, FIG. 1B shows spacing 201 between two sets of fins. The spacing 201 may be greater than the spacing 203 between the fins in the respective sets. In some cases, the spacing 201 separates sets of the fins 104 that are used to form different types of VTFETs, such as n-type and p-type VTFETs, or to separate pairs of VTFETs that form respective CMOS devices.

FIG. 1C shows a second cross-sectional view 150 of the FIG. 1A structure, taken along one of the fins 104 along the cross section CC shown in FIGS. 1A and 1B. FIG. 1D shows a third cross-sectional view 175 of the FIG. 1A structure, taken in a space between two of the fins 104 along the cross section DD shown in FIGS. 1A and 1B.

Figure 2A:
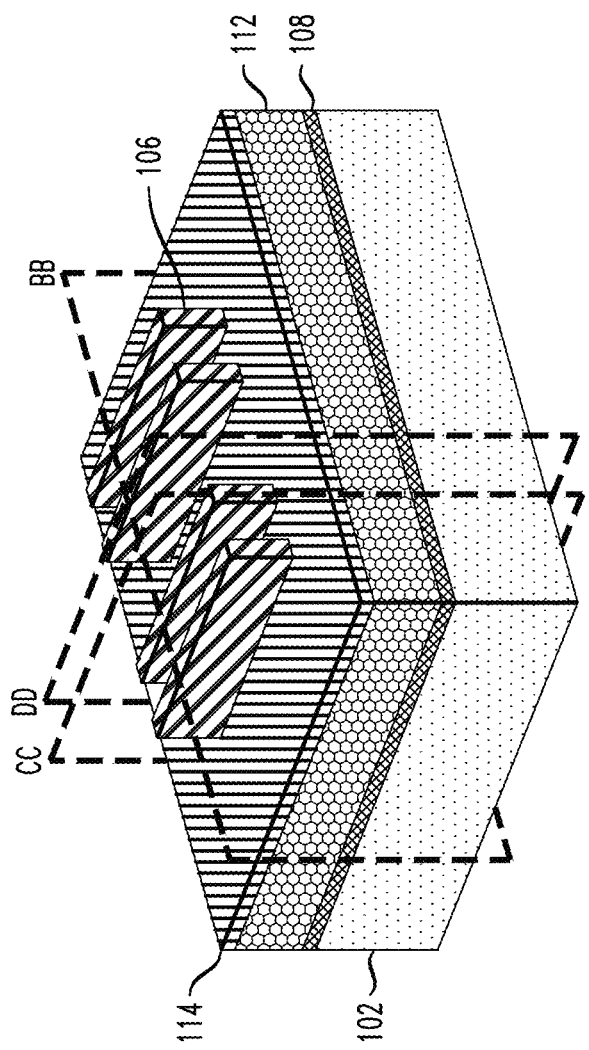
FIG. 2A depicts a perspective view of the FIG. 1A structure following formation of a bottom spacer, fin liner, dummy gate and top spacer, according to an embodiment of the invention.
Figure 2C:
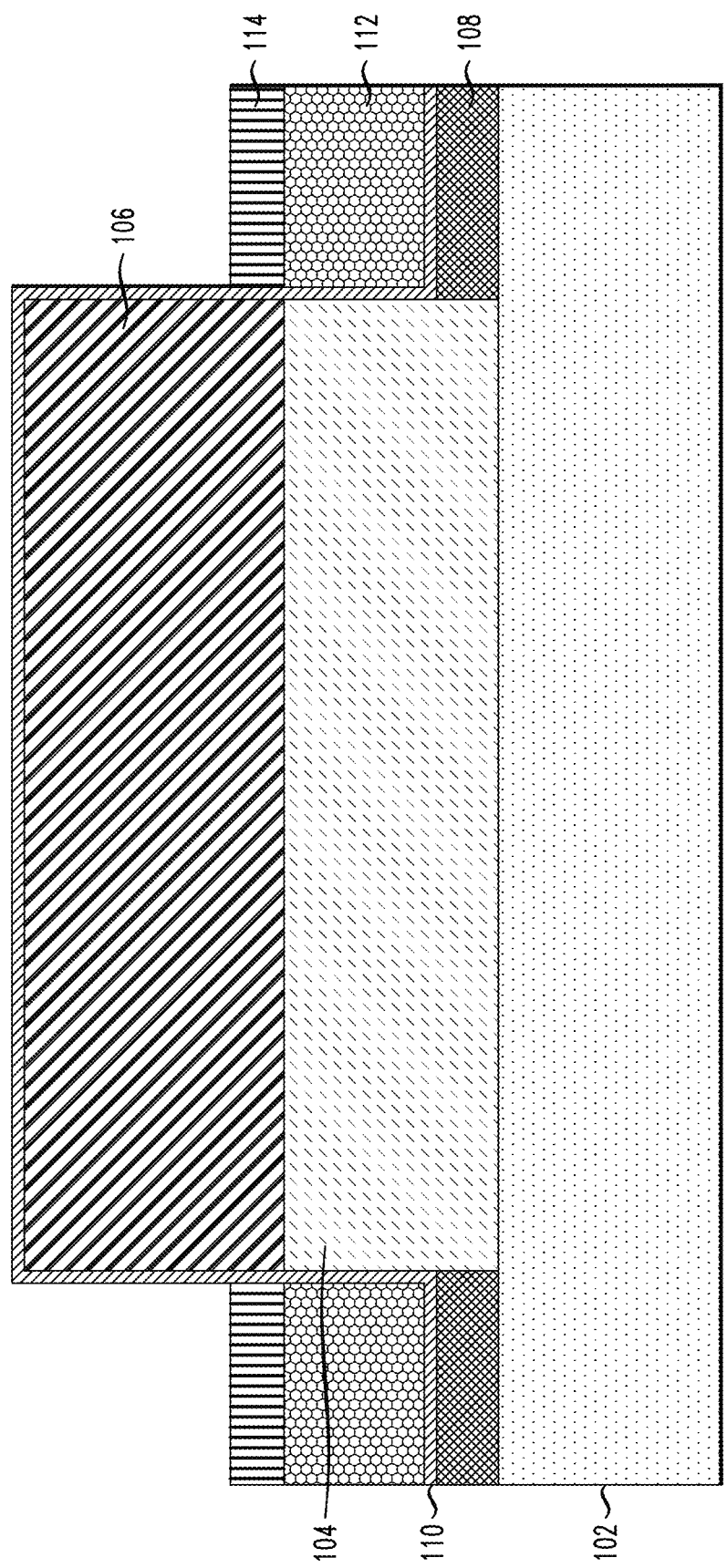
FIG. 2C depicts a second cross-sectional view of the FIG. 2A structure taken along one of the fins, according to an embodiment of the invention.
Figure 2D:
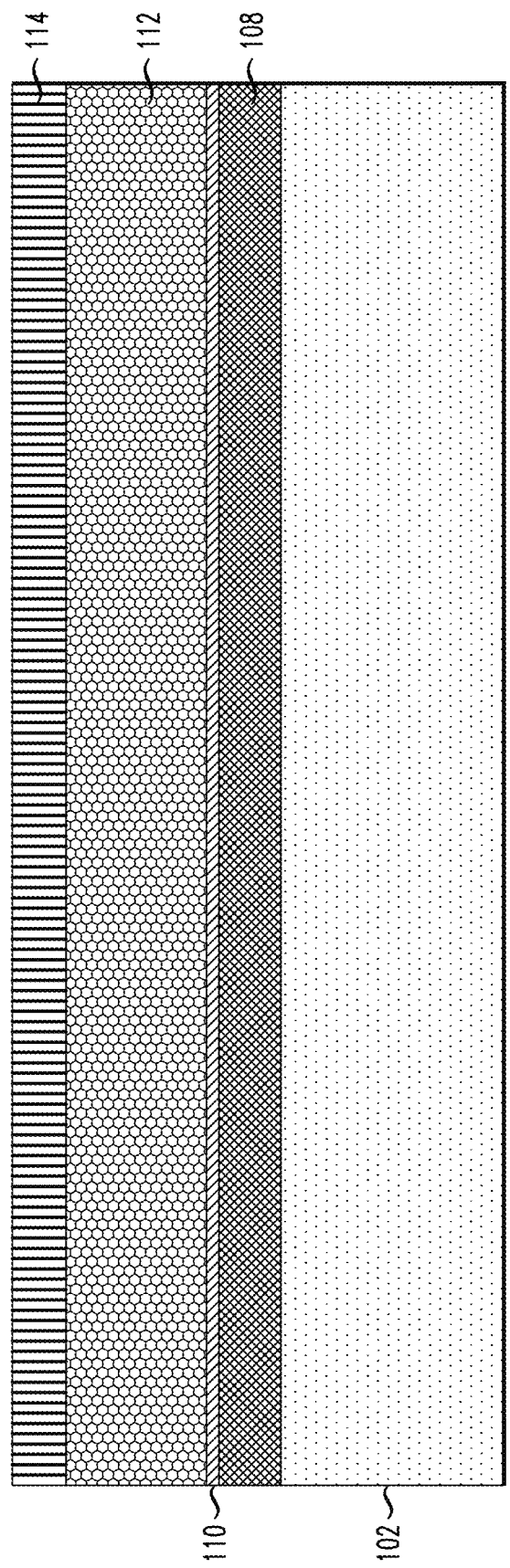
FIG. 2D depicts a third cross-sectional view of the FIG. 2A structure taken in an area between two of the fins, according to an embodiment of the invention.

FIG. 2A shows a perspective view 200 of the structure shown in FIGS. 1A-1D following formation of a bottom spacer 108, fin liner 110 (not shown in FIG. 2A), a dummy gate 112, and a top spacer 114. FIG. 2B shows a first cross-sectional view 225 of the FIG. 2A structure taken perpendicular to the fins 104 along the cross section BB shown in FIG. 2A. FIG. 2C shows a second cross-sectional view 250 of the FIG. 2A structure taken along one of the fins 104 along the cross section CC shown in FIGS. 2A and 2B. FIG. 2D shows a third cross-sectional view 275 taken in an area between two of the fins 104 along the cross section DD shown in FIGS. 2A and 2B.

Although not shown in FIGS. 2A-2C, a bottom source/drain layer may be formed on the substrate 102 by epitaxial growth. For example, the fin 104 may be further recessed after deposition and reactive-ion etching (RIE) of a fin protection liner. The bottom portion of the fin 104 and the top surface of the substrate 102 are thus exposed. The bottom source/drain is then selectively grown by epitaxy, followed by formation of the bottom spacer 108, fin liner 110, dummy gate 112 and top spacer 114.

The bottom spacer 108 may be formed using non-conformal deposition and etch-back processing, such as physical vapor deposition (PVD), high density plasma (HDP) deposition, etc. The bottom spacer 108 may be formed of silicon dioxide $SiO_2$, SiN, silicon carbide oxide (SiCO), silicon boron carbide nitride (SiBCN), etc., although other suitable materials may be used. The bottom spacer 108 may have a height or vertical thickness in the range of 3 nm to 10 nm, although other heights above or below this range may be used as desired for a particular application.

The fin liner 110 may be formed using a conformal deposition process such as atomic layer deposition (ALD) or chemical vapor deposition (CVD). The fin liner 110 may be formed of an oxide such as $SiO_2$, SiON, etc., although other suitable materials may be used. The fin liner 110 may have a uniform thickness in the range of 2 nm to 6 nm, although other thicknesses above or below this range may be used as desired for a particular application.

Dummy gate 112 is formed over the fin liner 110, using processing such as CVD or ALD. The dummy gate 112 may be formed of amorphous silicon (a-Si), amorphous silicon germanium (a-SiGe), $SiO_2$, titanium oxide ($TiO_2$), polysilicon or another suitable material. The dummy gate may have a height or vertical thickness in the range of 10 nm to 100 nm, although other heights above or below this range may be used as desired for a particular application. Generally, the height of the dummy gate 112 is such that the top surface of the dummy gate 112 is coplanar with a top surface of the fins 104.

The top spacer 114 is disposed over the dummy gate 112 as illustrated. The top spacer may be formed with similar processing and similar materials as that described above with respect to the bottom spacer 108. The top spacer 114 may have a height or vertical thickness in the range of 3 nm to 10 nm, although other heights above or below this range may be used as desired for a particular application.

Figure 3:
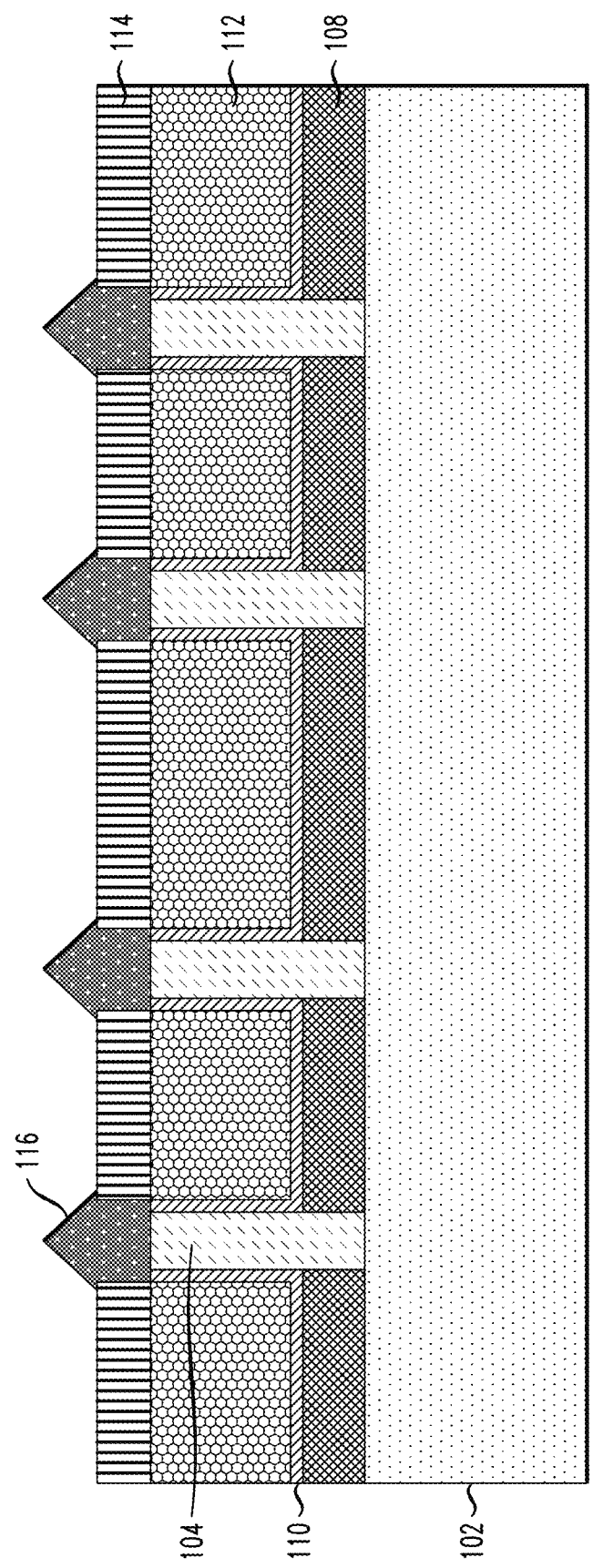
FIG. 3 depicts a cross-sectional view of the FIG. 2A structure taken perpendicular to the fins following removal of a hard mask and formation of top source/drain regions, according to an embodiment of the invention.
Figure 4:
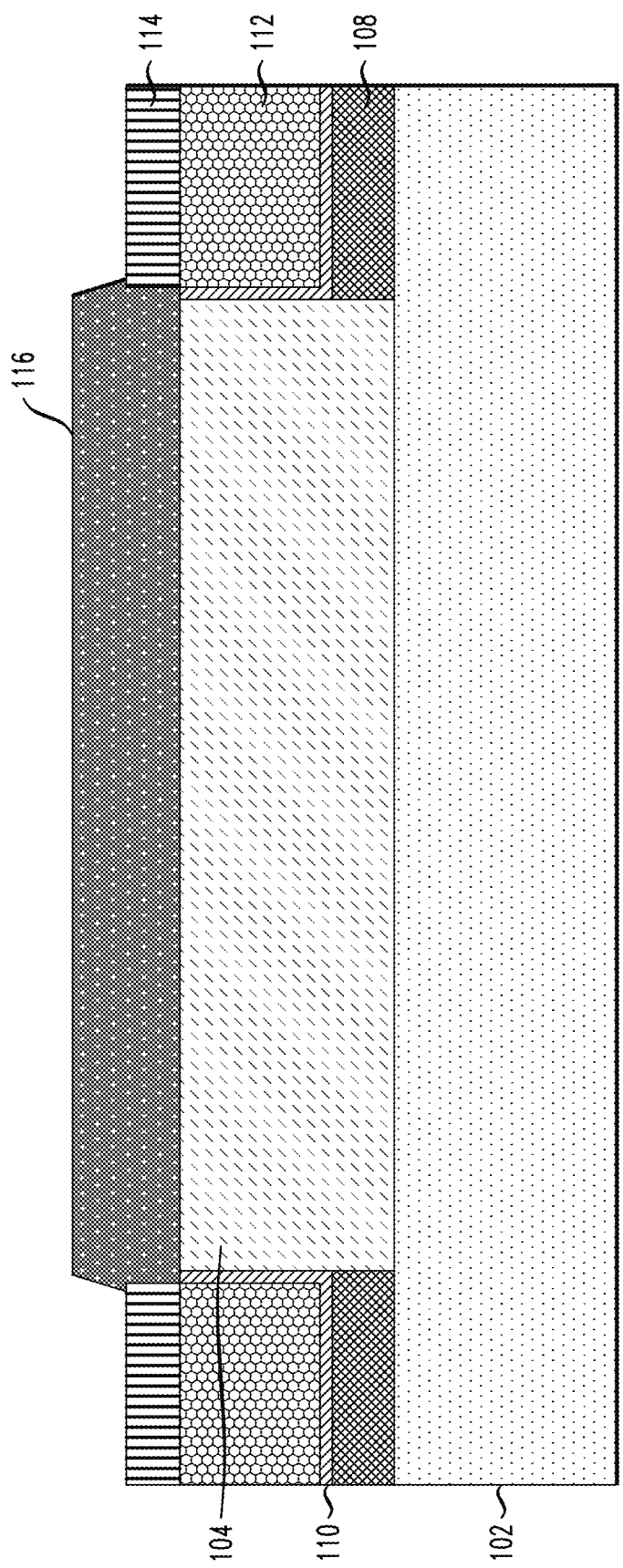
FIG. 4 depicts a cross-sectional view of the FIG. 2A structure taken along one of the fins following removal of the hard mask and formation of the top source/drain regions, according to an embodiment of the invention.

FIGS. 3 and 4 show cross-sectional views 300 and 400, respectively, of the structure shown in FIGS. 2A-2D following removal of the hard masks 106 and formation of top source/drain regions 116. The cross-sectional view 300, like the cross-sectional view 225 of FIG. 2B, is taken perpendicular to the fins 104. The cross-sectional view 400, like the cross-sectional view 250 of FIG. 2C, is taken along one of the fins 104.

The hard masks 106 may be removed using selective wet or dry etch processing. Removal of the hard masks 106 exposes the top surfaces of the underlying fins 104. The top source/drain regions 116 are then formed. In some embodiments, the top source/drain regions 116 are formed using selective doped epitaxial growth followed by an activation anneal. The activation anneal may be a spike rapid thermal anneal (sRTA), laser annealing, etc. In other embodiments, the top source/drain regions 116 are formed using selective epitaxial growth, followed by ion implantation for doping, followed by an activation anneal such as sRTA, laser annealing, etc. Advantageously, the thermal budget is not constrained or limited during the formation of the top source/drain regions 116 since illustrative embodiments utilize gate-last processes as compared to gate first processes. Thus, high temperature (e.g., temperatures above 900° C.) may be used during the activation anneal to provide better dopant activation relative to gate first techniques that have associated thermal budgets for forming top source/drain regions.

The top source/drain regions 116 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). As discussed above, the top source/drain regions 116 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

The top source/drain regions 116, as illustrated in FIGS. 3 and 4, fill the regions over the top surfaces of the fins 104 surrounded by the top spacer 114 that are exposed by removal of the hard masks 106. The top source/drain regions 116 are further formed above the top surface of the top spacer 114 as illustrated. The total height or vertical thickness of the top source/drain regions 116, measured from a top surface of the fins 104, may be in the range of 10 nm to 100 nm, although other heights above or below this range may be used as desired for a particular application.

Figure 5:
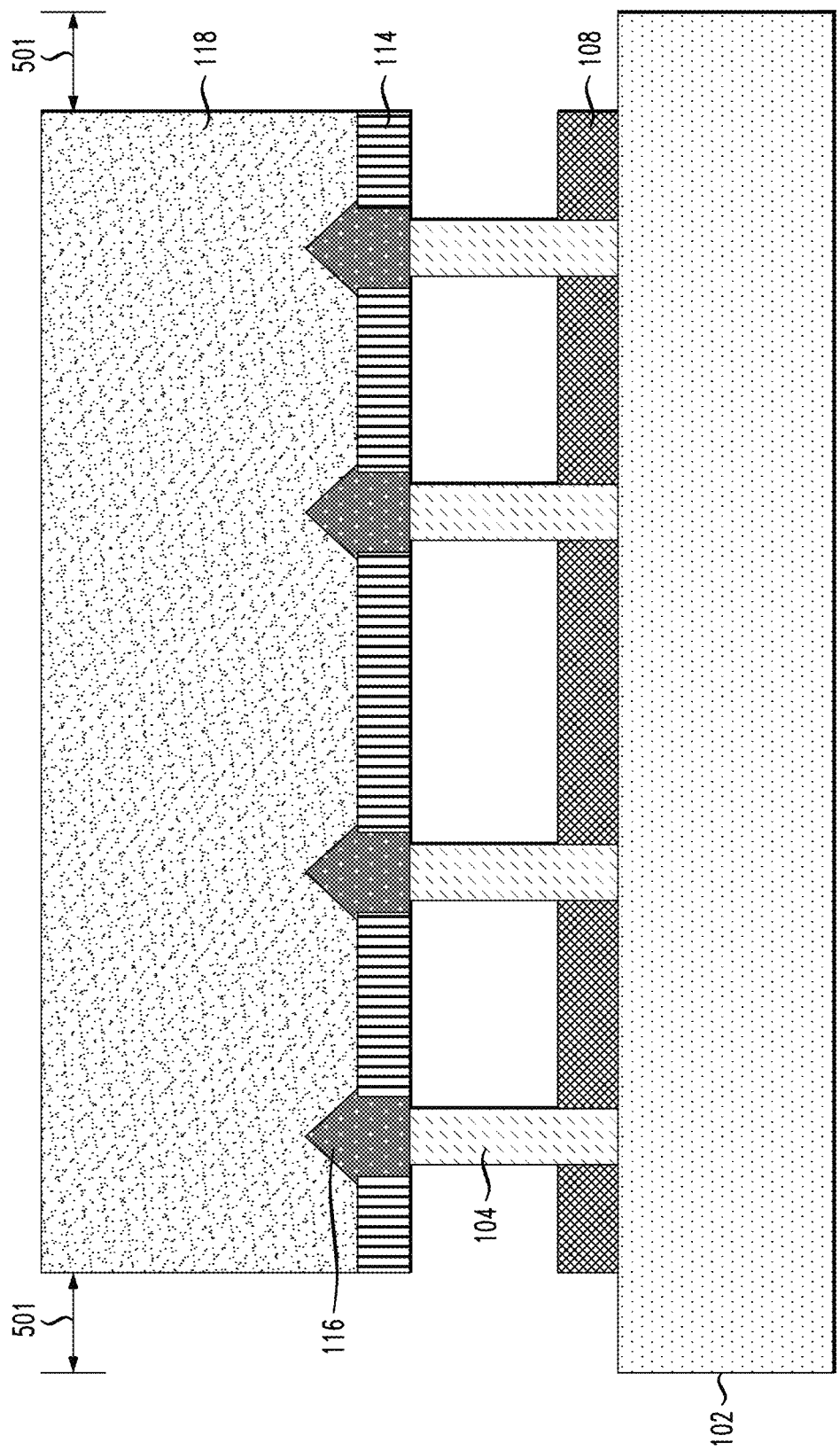
FIG. 5 depicts a cross-sectional view of the FIG. 3 structure following deposition of a thick oxide, patterning of the thick oxide and dummy gate, and removal of the dummy gate, according to an embodiment of the invention.
Figure 6:
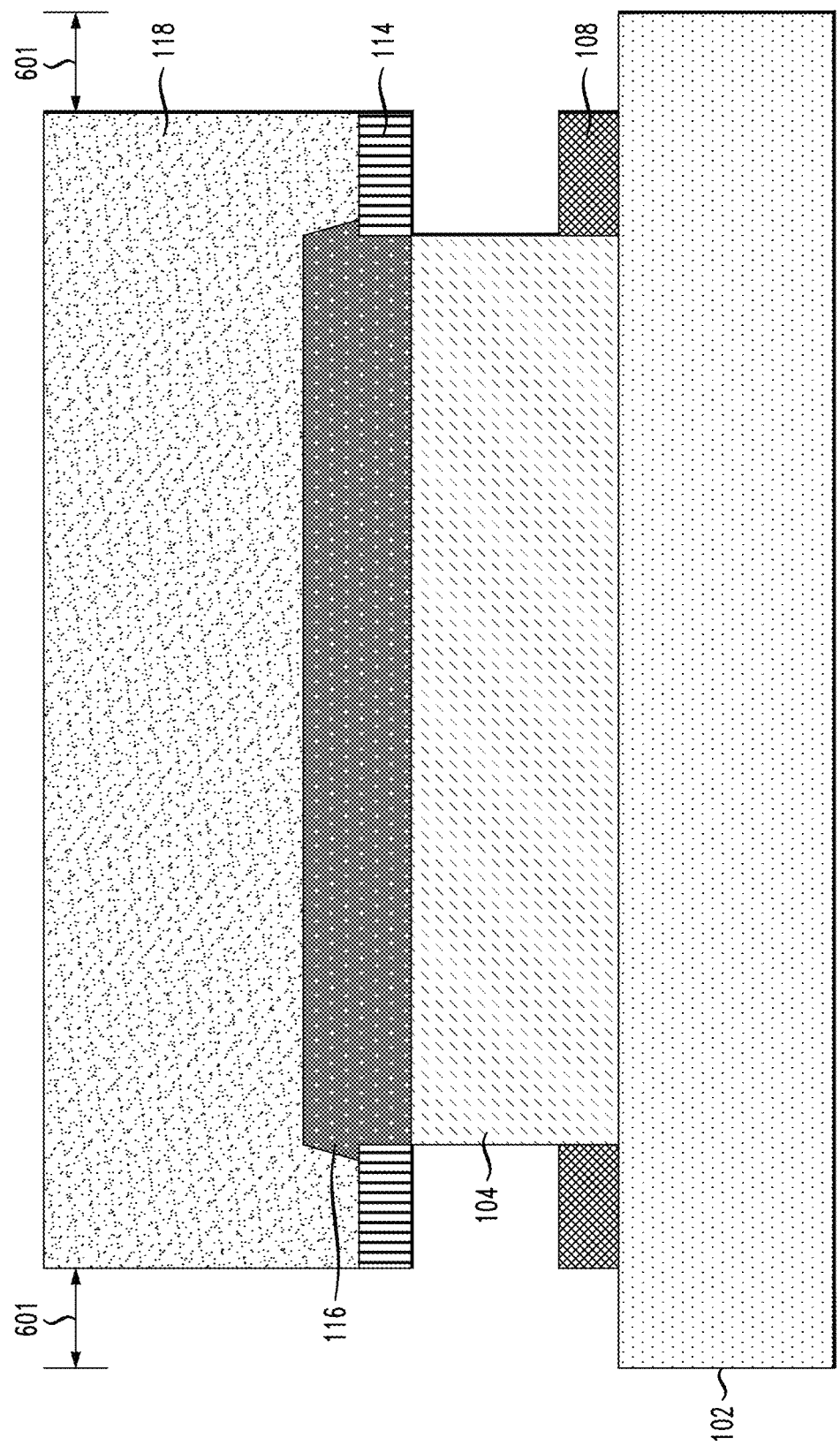
FIG. 6 depicts a cross-sectional view of the FIG. 4 structure following deposition of the thick oxide, patterning of the thick oxide and dummy gate, and removal of the dummy gate, according to an embodiment of the invention.
Figure 7:
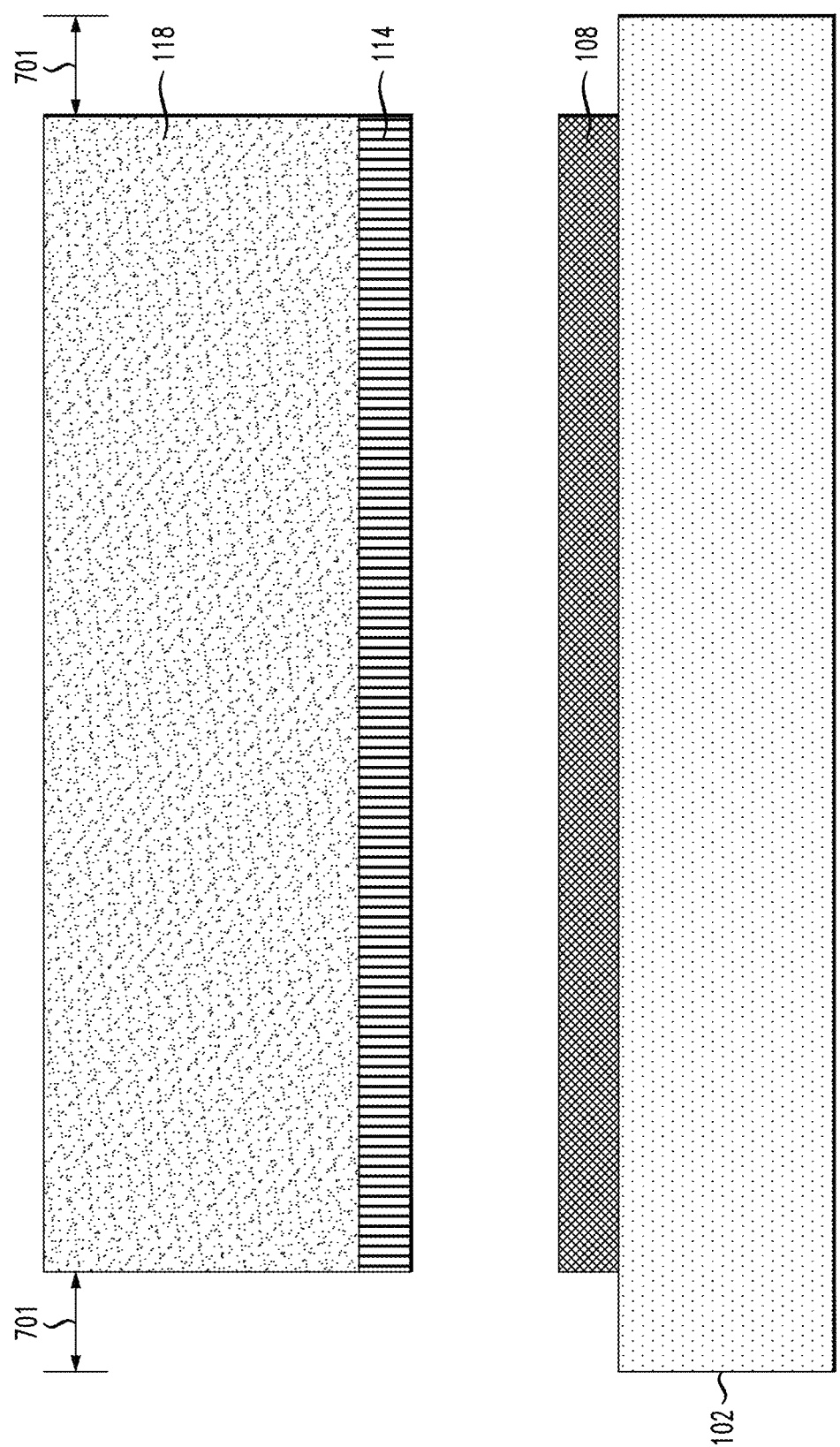
FIG. 7 depicts a cross-sectional view of the FIG. 2A structure taken in an area between two of the fins following deposition of the thick oxide, patterning of the thick oxide and dummy gate, and removal of the dummy gate, according to an embodiment of the invention.

FIGS. 5 and 6 show cross-sectional views 500 and 600, respectively, of the structure shown in FIGS. 3 and 4 following deposition of a thick oxide 118, patterning of the thick oxide 118 and dummy gate 112, and subsequent removal of the dummy gate 112. The cross-sectional view 500 of FIG. 5, similar to the cross-sectional view 300 of FIG. 3, is taken across the fins 104. The cross-sectional view 600 of FIG. 6, similar to the cross-sectional view 400 of FIG. 4, is taken along one of the fins 104. FIG. 7 shows another cross-sectional view 700 following deposition of the thick oxide 118, patterning of the thick oxide 118 and dummy gate 112, and subsequent removal of the dummy gate 112. The cross-sectional view 700 of FIG. 7, similar to the cross-sectional view 275 of FIG. 2D, is taken in an area between two of the fins 104.

The thick oxide 118 may initially be deposited over the entire structure, and then planarized using chemical mechanical polishing (CMP). The initial height of the thick oxide 118 following planarization may be in the range of 20 nm to 200 nm. The thick oxide 118 is then patterned to remove portions of the thick oxide 118 and underlying layers (e.g., top spacer 114, dummy gate 112 and bottom spacer 108) in the regions 501, 601 and 701 illustrated in FIGS. 5-7. Patterning of the thick oxide 118 and underlying layers may utilize RIE or other suitable processing.

After patterning of the thick oxide 118 and underlying layers, the dummy gate 112 is exposed and then selectively removed. The dummy gate 112 may be removed using selective wet or dry etch processing. The fin liner 110 acts as an etch stop layer during removal of the dummy gate 112. After removal of the dummy gate 112, the fin liner 110 is removed. The fin liner 110 may be removed using a diluted wet chemistry, such as diluted hydrofluoric acid (DHF) or buffered oxide etch (BHF). This patterning exposes the dummy gate 112, which is then selectively removed as illustrated in FIGS. 5-7.

Figure 8:
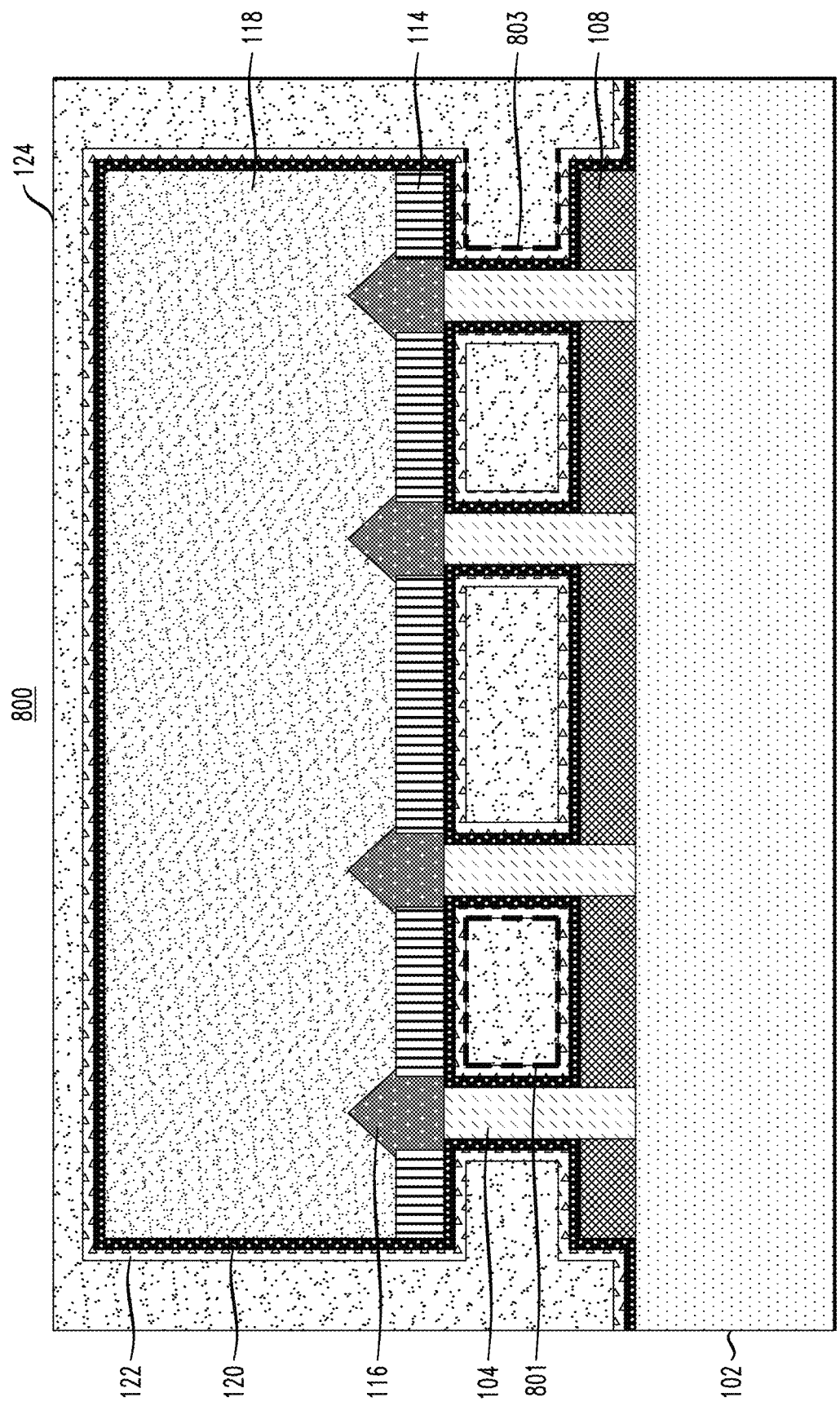
FIG. 8 depicts a cross-sectional view of the FIG. 5 structure following conformal deposition of a high-k dielectric, conformal deposition of a work function metal, and deposition of a gate material, according to an embodiment of the invention.
Figure 12:
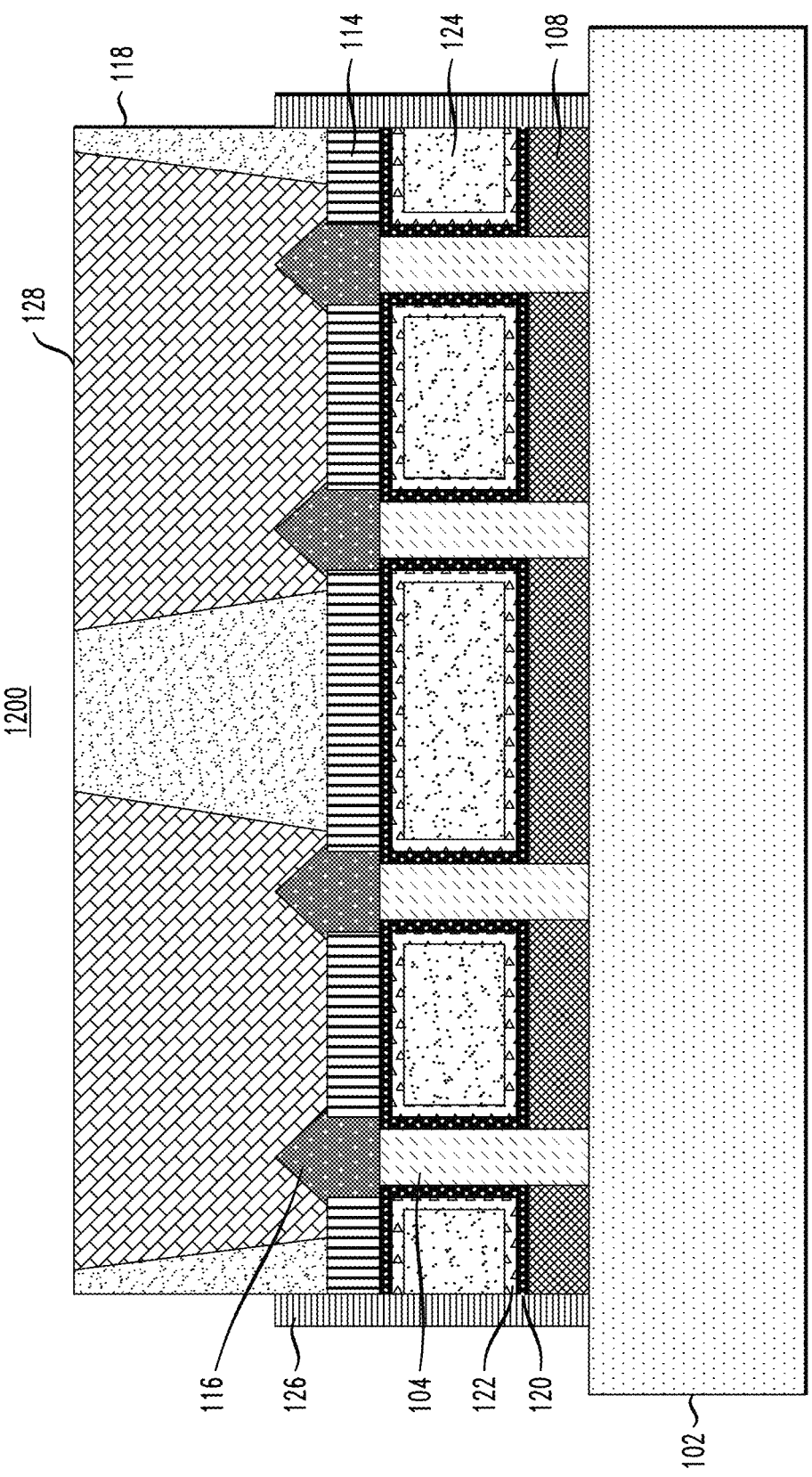
FIG. 12 depicts a cross-sectional view of the FIG. 11 structure following formation of top source/drain contacts, according to an embodiment of the invention.
Figure 13:
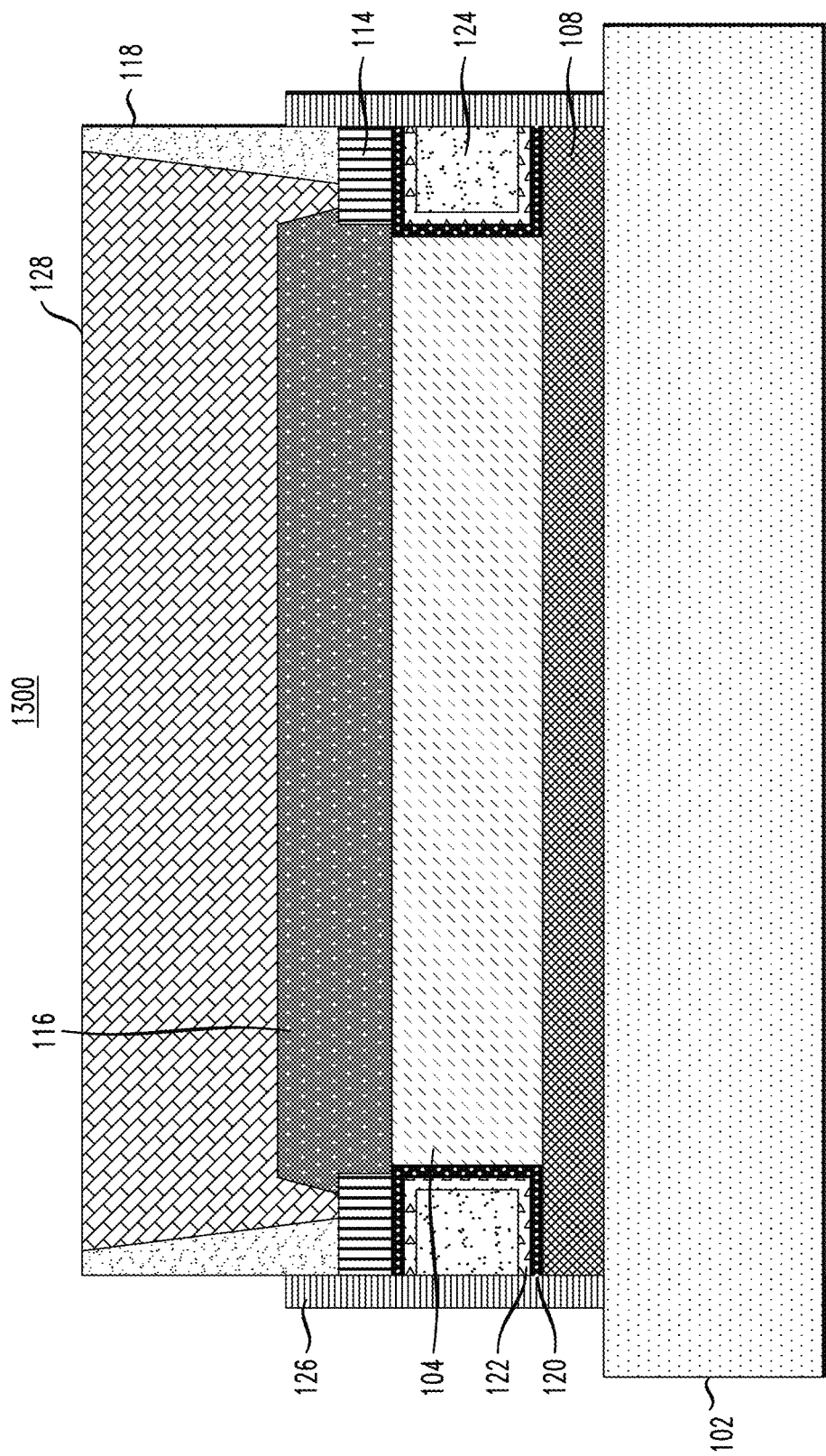
FIG. 13 depicts a cross-sectional view of the FIG. 6 structure following conformal deposition of a high-k dielectric, conformal deposition of a work function metal, deposition of a gate material, chemical mechanical polishing to expose a top surface of the thick oxide, gate patterning, deposition and etching of sidewall spacers, and formation of top source/drain contacts, according to an embodiment of the invention.
Figure 14:
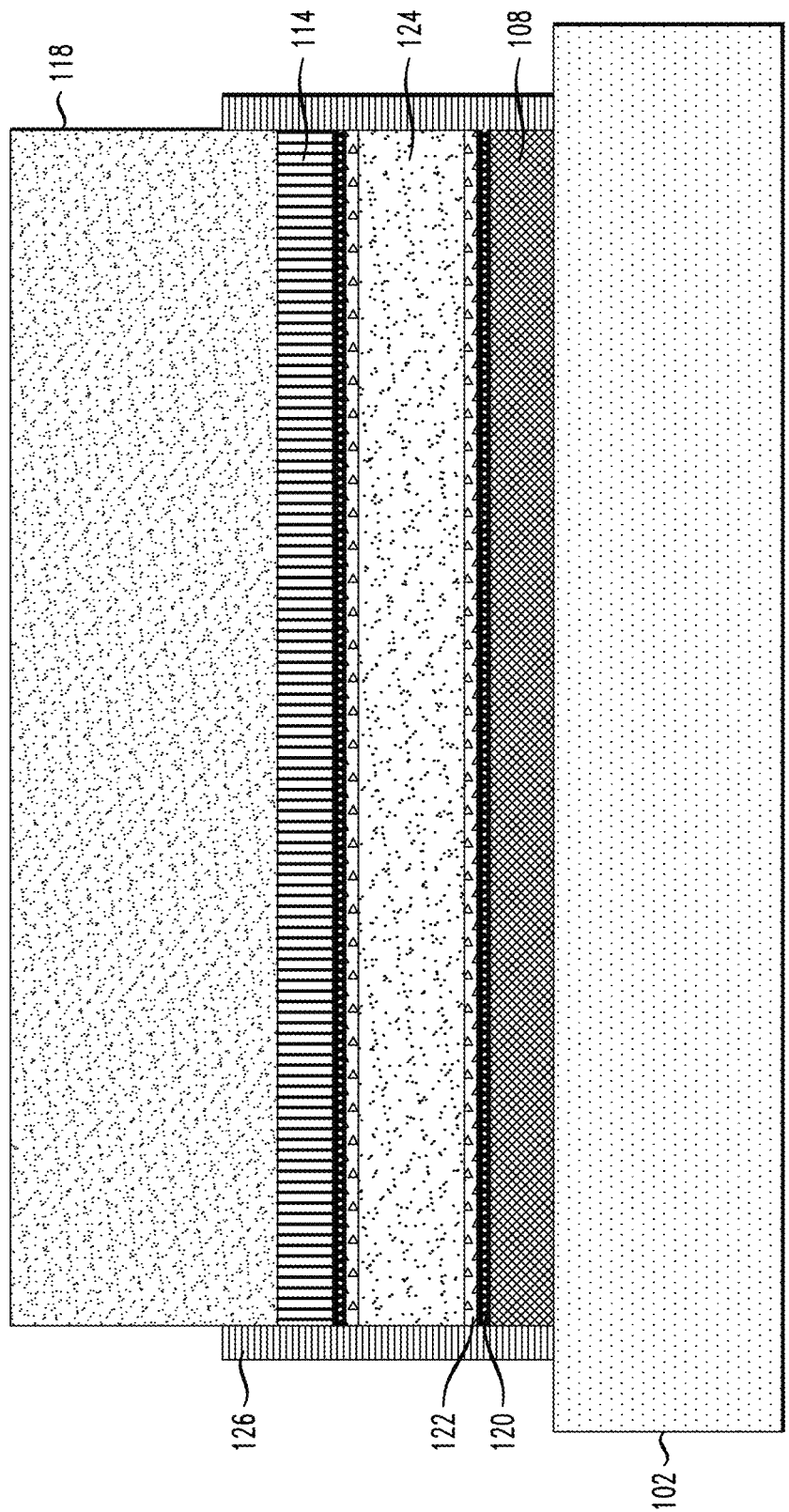
FIG. 14 depicts a cross-sectional view of the FIG. 7 structure following conformal deposition of a high-k dielectric, conformal deposition of a work function metal, deposition of a gate material, chemical mechanical polishing to expose a top surface of the thick oxide, gate patterning, deposition and etching of sidewall spacers, and formation of top source/drain contacts, according to an embodiment of the invention.

FIG. 8 depicts a cross-sectional view 800 of the FIG. 5 structure following conformal deposition of a gate dielectric 120, conformal deposition of a work function metal layer 122, and deposition of a gate conductor material 124. It should be noted that FIG. 8, along with FIGS. 9-11 described below, are all cross-sectional views that are taken across the fins 104. Cross-sectional views taken along one of the fins 104 and in a space between two of the fins 104 are not shown for clarity of illustration. FIGS. 12-14 show cross-sectional views of a resulting structure taken across the fins 104, along one of the fins 104 and in a space between two of the fins 104, respectively.

The gate dielectric 120 may be formed of a high-k dielectric material, although other suitable materials may be used. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The gate dielectric 120 may have a uniform thickness in the range of 1 nm to 5 nm, although other thicknesses above or below this range may be used as desired for a particular application.

The gate dielectric 120 may be formed using a conformal deposition process, such as ALD. Although not shown in FIG. 8, an interfacial layer may be formed on the sidewalls of the fins 104 before formation of the gate dielectric 120. The interfacial layer may be formed of SiO$_2$, SiON or another suitable material, with a thickness in the range of 0.5 nm to 3 nm.

The work function metal (WFM) layer 122 may be used to set the threshold voltage of the vertical transistor to a desired value. In some embodiments, the WFM layer 122 comprises titanium nitride (TiN), or a multi-layer of TiN, titanium carbide (TiC) and TiN (e.g., TiN/TiC/TiN). Other suitable materials for the WFM layer 122 include a nitride, including but not limited to TiN, titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to TiC, titanium aluminum carbide (TiAlC), tantalum carbide (TaC), hafnium carbide (HfC), and combinations thereof.

The WFM layer 122 may be formed using a conformal deposition process such as ALD. The WFM layer 122 may have a thickness in the range of 3 nm to 20 nm, although other thickness above or below this range may be used as desired for a particular application.

The gate conductor 124 is then deposited, such as using CVD. The gate conductor 124 may be formed of tungsten (W) or another metal such as titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc. The gate conductor 124 may also or alternatively be formed of a conducting metallic compound material (e.g., tantalum nitride (TaN), titanium nitride (TiN), tantalum carbide (TaC$_x$), titanium carbide (TiC), titanium aluminum carbide, tungsten silicide (WSi$_2$), tungsten nitride (WN), ruthenium oxide (RuO$_2$), cobalt silicide, nickel silicide, etc.). The gate conductor 124 may also be any suitable combination of a metal, a conducting metallic compound material, and other suitable materials. The gate conductor 124 may further be formed of a material that comprises dopants incorporated during or after deposition.

The gate conductor 124 fills regions exposed by removal of the dummy gate 112, and also overfills the entire structure as illustrated in FIG. 8. The gate conductor 124 is later patterned as will be described in further detail below with respect to FIGS. 9 and 10.

As shown in the bold dashed outline 801 of FIG. 8, the gate dielectric 120, WFM layer 122 and gate conductor 124 form a □-shaped (BOX profile) in the tight spacing between the fins 104. As shown in the bold dashed outline 803 of FIG. 8, the gate dielectric 120, WFM layer 122 and gate conductor 124 form a C-shaped profile at the end of the gates (e.g., at the edges of the structure outside the fins 104).

Figure 9:
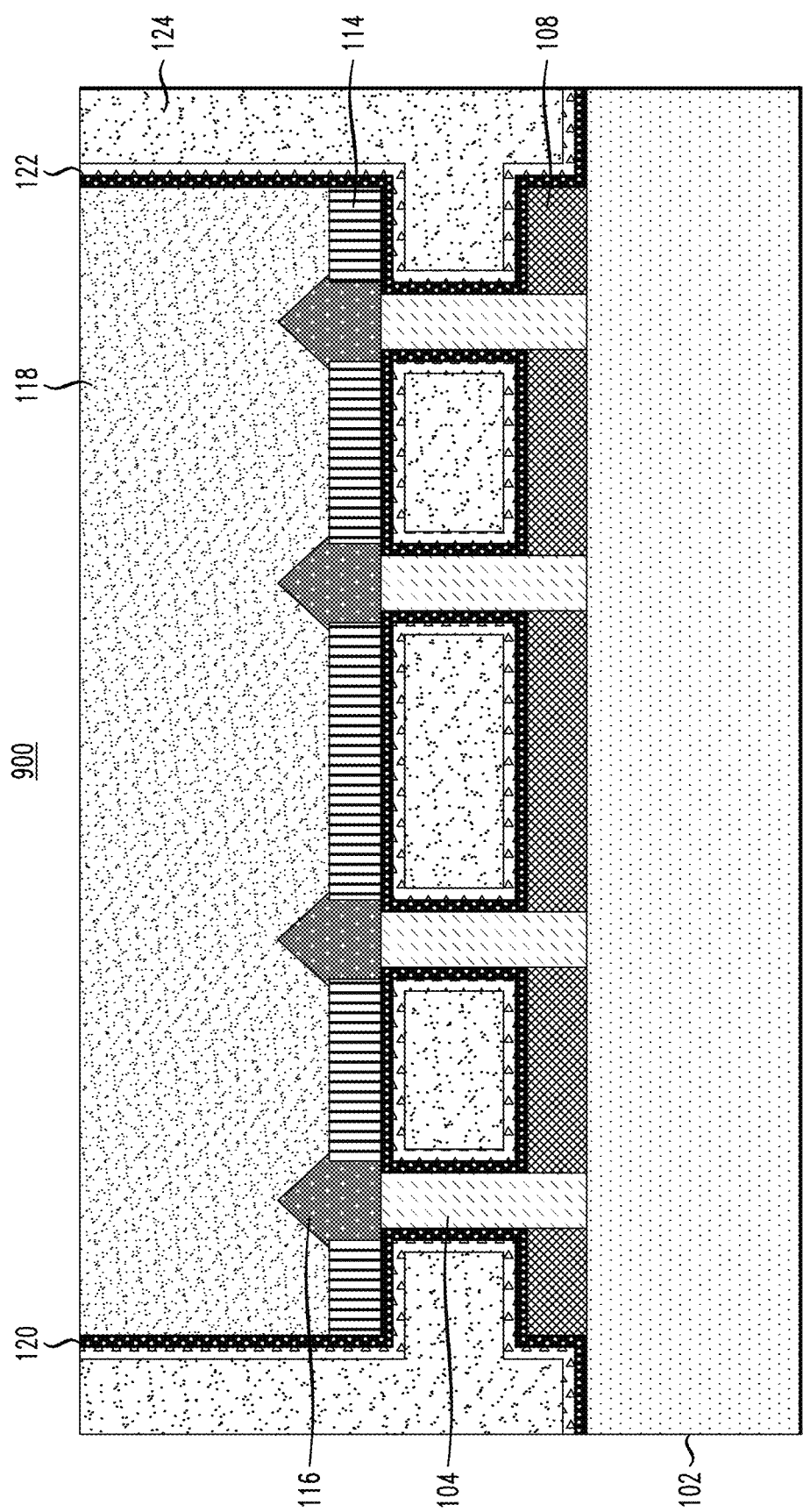
FIG. 9 depicts a cross-sectional view of the FIG. 8 structure following chemical mechanical polishing to expose a top surface of the thick oxide, according to an embodiment of the invention.

FIG. 9 shows a cross-sectional view 900 of the FIG. 8 structure following planarization (e.g., CMP) to expose a top surface of the thick oxide 118.

Figure 10:
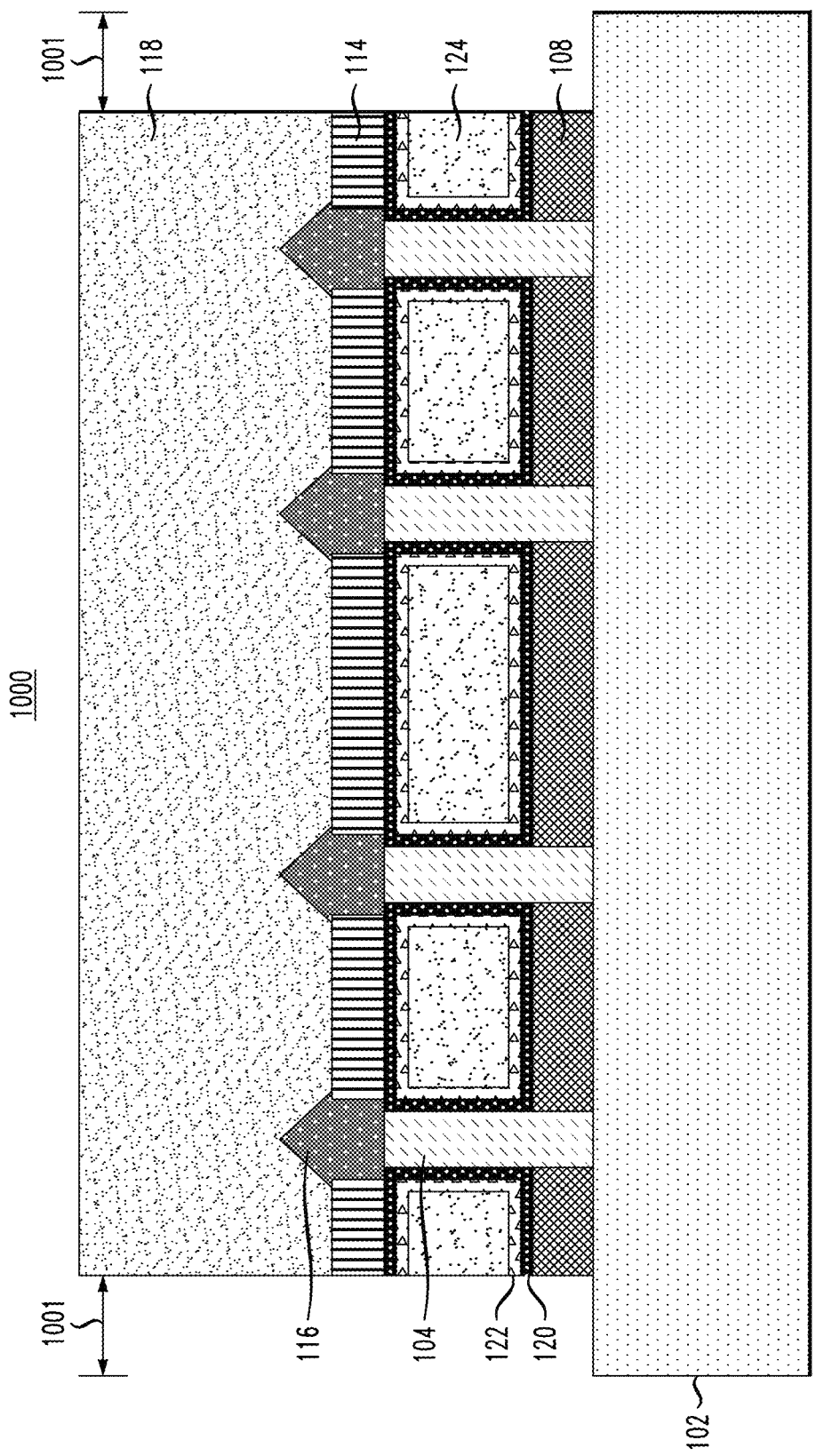
FIG. 10 depicts a cross-sectional view of the FIG. 9 structure following gate patterning, according to an embodiment of the invention.

FIG. 10 shows a cross-sectional view 1000 of the FIG. 9 structure following gate patterning, wherein portions of the gate conductor 124, WFM layer 122, gate dielectric 120, thick oxide 118, top spacer 114 and bottom spacer 108 are removed in the regions 1001. The portions of these layers in the regions 1001 may be removed using RIE or other suitable processing.

Figure 11:
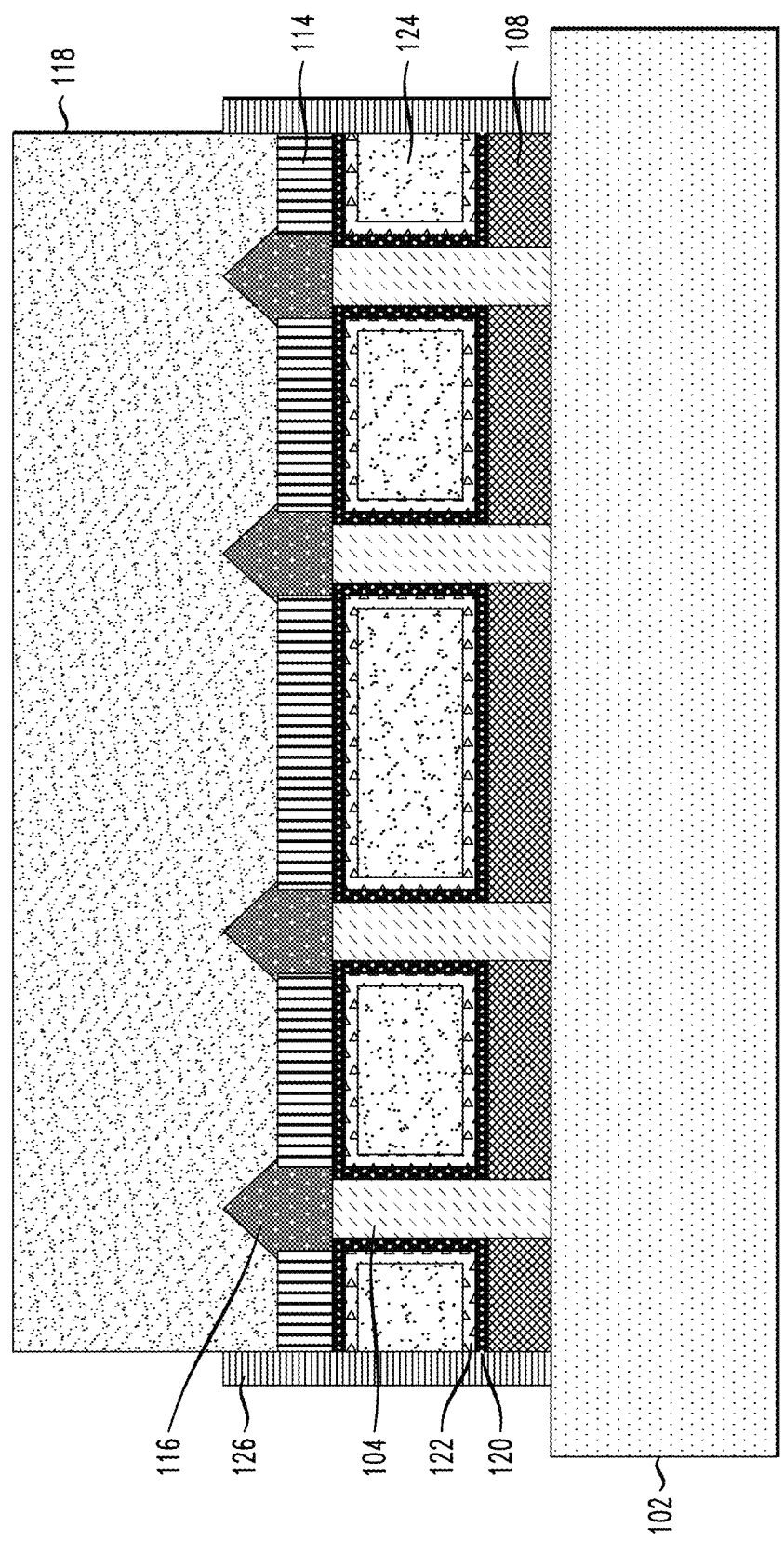
FIG. 11 depicts a cross-sectional view of the FIG. 10 structure following deposition and etching of sidewall spacers, according to an embodiment of the invention.

FIG. 11 shows a cross-sectional view 1100 of the FIG. 10 structure following formation of sidewall spacers 126. The sidewall spacers 126 may be formed by deposition of spacer material over the structure using ALD, CVD or other suitable processing to encapsulate the gate material (e.g., gate dielectric 120, WFM layer 122 and gate conductor 124) at the ends of the structure. The spacer material may then be etched, such as using RIE, to result in the sidewall spacers 126 shown in FIG. 11.

The sidewall spacers 126 may be formed of SiN, SiON, SiBCN, SiCO or another suitable material. The sidewall spacers 126 may have a horizontal thickness or width in the range of 3 nm to 10 nm, and a vertical thickness or height in the range of 30 nm to 100 nm, although other widths and heights above or below these ranges may be used as desired. The height of the sidewall spacers 126, however, should be enough such that the gate material is encapsulated (e.g., the sidewall spacers 126 have a height such that the top surface thereof is equal to or exceeds that of the top surface of the top spacers 114).

FIGS. 12-14 show cross sectional views 1200, 1300 and 1400, respectively, of the FIG. 11 structure following formation of top contacts 128. The cross-sectional view 1200 of FIG. 12, similar to the cross-sectional views of FIGS. 9-11, is taken across the fins 104. The cross-sectional view 1300 of FIG. 13, similar to FIG. 6, is taken along one of the fins 104. The cross-sectional view 1400 of FIG. 14, similar to FIG. 7, is taken in an area between two of the fins 104.

The top contacts 128 may be formed by patterning a mask (e.g., an organic polymer layer (OPL), SiN, photoresist, etc.) over the thick oxide 118, and removing portions of the thick oxide 118 exposed by the mask to reveal or expose the top source/drain regions 116 and portions of the top spacer 114 surrounding the top source/drain regions 116. As shown in FIG. 12, two separate top contacts 128 are formed for first and second sets of the fins 104. The first and second sets of fins 104 may represent respective CMOS devices, where the top source/drain regions 116 in each set have different dopant types for forming a pair of VTFETs (e.g., with one of the top source/drain regions 116 in each set being n-type doped and the other being p-type doped).

The top contacts 128 may have a width that varies as needed to connect to the top source/drain regions for each set of the fins 104, and have a height that matches that of the top surface of the thick oxide 118. The top contacts 128 may be formed of tungsten (W), although other suitable materials such as titanium (Ti), cobalt (Co), etc. may be used. The material for the top contacts 128 may be filled in the regions exposed by removal of the thick oxide 118, followed by planarizing using CMP or another suitable technique such that the top surface of the top contacts 128 is substantially coplanar with a top surface of the thick oxide 118.

Illustrative embodiments provide a number of advantages relative to conventional techniques. As discussed above, gate first techniques for forming VTFETs suffer from disadvantages associated with the thermal budget imposed on subsequent processing steps after formation of the gate. In some embodiments, fins are formed first without requiring fin formation through epitaxial growth. Also, some embodiments permit the formation of top source/drain regions through selective epitaxial growth for doped source/drain since there is no thermal constraint, as opposed to conventional techniques which may require doped polysilicon deposition (e.g., non-selective deposition). Further, some embodiments provide for conformal deposition of gate dielectric and WFM layers, resulting in a □-shaped (BOX profile) of the gate dielectric and WFM layers in the tight spacing between the fins. Conventional gate first techniques, however, may require a thermally grown gate dielectric with an I-shaped or line profile. Further, some embodiments enable scalability through the formation of devices with multiple fins.

In some embodiments, a method of forming a semiconductor structure comprises forming a plurality of fins disposed over a top surface of a substrate, and forming one or more VTFETs from the plurality of fins, the plurality of fins comprising channels for the one or more VTFETs. The method also comprises forming a gate stack for the one or more VTFETs surrounding at least a portion of the plurality of fins, the gate stack comprising a gate dielectric disposed on the plurality of fins, a WFM layer disposed on the gate dielectric, and a gate conductor disposed on the WFM layer. The gate stack comprises a box profile in an area between at least two adjacent ones of the plurality of fins.

Forming the one or more VTFETs may comprise forming a hard mask over top surfaces of the plurality of fins, forming a bottom spacer disposed over the top surface of the substrate surrounding the plurality of fins, forming a fin liner disposed over the bottom spacer, exposed sidewalls of the plurality of fins, and the hard mask, forming a dummy gate disposed over the fin liner surrounding sidewalls of the plurality of fins, and forming a top spacer disposed over the dummy gate surrounding the fin liner on at least a portion of sidewalls of the hard mask.

Forming the one or more VTFETs may further comprise removing the hard mask to expose the top surfaces of the plurality of fins, forming top source/drain regions disposed on the exposed top surfaces of the plurality of fins. Forming the top source/drain regions may comprise utilizing at least one process without a thermal budget. Forming the top source/drain regions may comprise selective doped epitaxial growth followed by an activation anneal. Forming the top source/drain regions may comprise selective epitaxial growth followed by doped ion implantation followed by an activation anneal.

Forming the one or more VTFETs may further comprise depositing and planarizing an oxide layer over the top spacers and the top source/drain regions, patterning the oxide layer to remove a portion of the oxide layer and underlying portions of the top spacer, the dummy gate, the fin liner and the bottom spacer disposed over edges of the top surface of the substrate outside the plurality of fins, and selectively removing the dummy gate and the fin liner.

Forming the gate stack for the one or more VTFETs may comprise conformally depositing the gate dielectric on exposed sidewalls of the plurality of fins, the top surface of the substrate and exposed surfaces of the bottom spacer, the top spacer and the oxide layer, conformally depositing the work function metal layer on the gate dielectric, depositing material for the gate conductor to the fill the structure, performing CMP to expose a top surface of the oxide layer, patterning the gate stack to remove portions of the material for the gate conductor, the work function metal layer, the gate dielectric, the oxide layer, the top spacer, and the bottom spacer disposed over edges of the top surface of the substrate outside the plurality of fins, and forming a sidewall spacer over a top surface of the substrate encapsulating edges of the gate stack.

The method may further comprise removing at least a portion of the oxide layer disposed over the top source/drain regions, and forming contacts to the top source/drain regions in regions exposed by removal of the portion of the oxide layer.

Forming the one or more VTFETs may further comprise forming a bottom spacer disposed over the top surface of the substrate surrounding at least a portion of the sidewalls of the plurality of fins, forming top source/drain regions disposed over top surfaces of the plurality of fins, and forming a top spacer surrounding the top source/drain regions. The box profile in the area between the two adjacent fins may comprise: the gate dielectric disposed on: (i) sidewalls of the two adjacent fins above the bottom spacer; (ii) a top surface of the bottom spacer; and (iii) a bottom surface of the top spacer; the WFM layer disposed on the gate dielectric; and the gate conductor disposed on the WFM layer filling a remaining space between the two adjacent fins, the bottom spacer and the top spacer.

The gate stack may comprise a C-shaped profile adjacent at least one of the plurality of fins at an edge of the semiconductor structure, and the method may further comprise forming a sidewall spacer disposed over the top surface of the substrate adjacent the edge of the semiconductor structure encapsulating the bottom spacer, the gate stack, and the top spacer. The C-shaped profile adjacent the at least one fin at the edge of the semiconductor structure may comprise: the gate dielectric disposed on: (i) a sidewall of the at least one fin above the bottom spacer; (ii) a top surface of the bottom spacer; and (iii) a bottom surface of the top spacer; the WFM layer disposed on the gate dielectric; and the gate conductor disposed on the WFM layer filling a remaining space between the at least one fin and the sidewall spacer.

The method may further comprise forming top source/drain regions for the one or more vertical transport field-effect transistors prior to formation of the gate stack.

In some embodiments, a semiconductor structure comprises a substrate, a plurality of fins disposed over a top surface of the substrate, the plurality of fins comprising channels for one or more VTFETs, and a gate stack surrounding at least a portion of the plurality of fins, the gate stack comprising a gate dielectric disposed on the plurality of fins, a work function metal layer disposed on the gate dielectric, and a gate conductor disposed on the work function metal layer. The gate stack comprises a box profile in an area between at least two adjacent ones of the plurality of fins.

The semiconductor structure may further comprise a bottom spacer disposed over the top surface of the substrate surrounding at least a portion of the sidewalls of the plurality of fins, top source/drain regions disposed over top surfaces of the plurality of fins, and a top spacer surrounding the top source/drain regions. The box profile in the area between the two adjacent fins may comprise: the gate dielectric disposed on: (i) sidewalls of the two adjacent fins above the bottom spacer; (ii) a top surface of the bottom spacer; and (iii) a bottom surface of the top spacer; the WFM layer disposed on the gate dielectric; and the gate conductor disposed on the work function metal layer filling a remaining space between the two adjacent fins, the bottom spacer and the top spacer.

The gate stack may comprise a C-shaped profile adjacent at least one of the plurality of fins at an edge of the semiconductor structure, and the semiconductor structure may further comprise a sidewall spacer disposed over the top surface of the substrate adjacent the edge of the semiconductor structure encapsulating the bottom spacer, the gate stack, and the top spacer. The C-shaped profile adjacent the at least one fin at the edge of the semiconductor structure may comprise: the gate dielectric disposed on: (i) a sidewall of the at least one fin above the bottom spacer; (ii) a top surface of the bottom spacer; and (iii) a bottom surface of the top spacer; the WFM layer disposed on the gate dielectric; and the gate conductor disposed on the WFM layer filling a remaining space between the at least one fin and the sidewall spacer.

In some embodiments, an integrated circuit comprises one or more VTFETs comprising a substrate, a plurality of fins disposed over a top surface of the substrate, the plurality of fins comprising channels for the one or more VTFETs, and a gate stack surrounding at least a portion of the plurality of fins, the gate stack comprising a gate dielectric disposed on the plurality of fins, a WFM layer disposed on the gate dielectric, and a gate conductor disposed on the WFM layer. The gate stack comprises a box profile in an area between at least two adjacent ones of the plurality of fins.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a substrate;
   a plurality of fins disposed over a top surface of the substrate, the plurality of fins comprising channels for one or more vertical transport field-effect transistors; and
   a gate stack surrounding at least a portion of the plurality of fins, the gate stack comprising a gate dielectric layer, a work function metal layer, and a gate conductor layer;
   wherein the gate stack comprises a box profile in an area between at least two adjacent ones of the plurality of fins;
   wherein the box profile in the area between the at least two adjacent fins comprises:
      the gate dielectric layer disposed on (i) sidewalls of the two adjacent fins, (ii) portions of a top surface of a bottom spacer extending between the at least two adjacent fins, and (iii) portions of a bottom surface of a top spacer extending between the at least two adjacent fins;
      the work function metal layer disposed on interior surfaces of the gate dielectric layer; and
      the gate conductor layer filling a cavity defined by interior surfaces of the work function metal layer.

2. The semiconductor structure of claim 1, further comprising:
   the bottom spacer disposed over the top surface of the substrate surrounding at least a portion of the sidewalls of the plurality of fins;
   top source/drain regions disposed over top surfaces of the plurality of fins; and
   a top spacer surrounding the top source/drain regions.

3. The semiconductor structure of claim 2, wherein the gate stack comprises a C-shaped profile adjacent at least one of the plurality of fins at an edge of the semiconductor structure, and further comprising a sidewall spacer disposed over the top surface of the substrate adjacent the edge of the semiconductor structure encapsulating the bottom spacer, the gate stack, and the top spacer.

4. The semiconductor structure of claim 3, wherein the C-shaped profile adjacent the at least one fin at the edge of the semiconductor structure comprises:
   the gate dielectric layer disposed on: (i) a sidewall of the at least one fin above the bottom spacer; (ii) a top surface of the bottom spacer; and (iii) a bottom surface of the top spacer;
   the work function metal layer disposed on the gate dielectric layer; and
   the gate conductor layer disposed on the work function metal layer filling a remaining space between the at least one fin and the sidewall spacer.

5. The semiconductor structure of claim 1, wherein the gate dielectric layer isolates the gate conductor layer and the work function metal layer from the sidewalls of the plurality of fins, the bottom spacer, and the top spacer.

6. The semiconductor structure of claim 1, wherein the box profile in the area between the at least two adjacent fins comprises the gate dielectric layer encapsulating a top, a bottom and sidewalls of the work function metal layer.

7. The semiconductor structure of claim 1, wherein the box profile in the area between the at least two adjacent fins comprises the work function metal layer encapsulating a top, a bottom and sidewalls of the gate conductor layer.

8. The semiconductor structure of claim 1, wherein the gate stack comprises a C-shaped profile adjacent at least one of the plurality of fins at an edge of the semiconductor structure, and further comprising a sidewall spacer disposed over the top surface of the substrate adjacent the edge of the semiconductor structure encapsulating the bottom spacer, the gate stack, and the top spacer.

9. The semiconductor structure of claim 8, wherein the C-shaped profile adjacent the at least one fin at the edge of the semiconductor structure comprises:
   the gate dielectric layer disposed on: (i) a sidewall of the at least one fin at the edge of the semiconductor structure above the bottom spacer; (ii) the top surface of the bottom spacer; and (iii) the bottom surface of the top spacer;
   the work function metal layer disposed on the gate dielectric layer; and
   the gate conductor layer disposed on the work function metal layer filling a remaining space between the sidewall spacer and the work function metal layer.

10. The semiconductor structure of claim 1, wherein the gate dielectric layer and the work function metal layer are each formed using a conformal deposition process.

11. An integrated circuit comprising:
    one or more vertical transport field-effect transistors comprising:
       a substrate;
       a plurality of fins disposed over a top surface of the substrate, the plurality of fins comprising channels for the one or more vertical transport field-effect transistors; and
       a gate stack surrounding at least a portion of the plurality of fins, the gate stack comprising a gate dielectric layer, a work function metal layer, and a gate conductor layer;
    wherein the gate stack comprises a box profile in an area between at least two adjacent ones of the plurality of fins;
    wherein the box profile in the area between the at least two adjacent fins comprises:
       the gate dielectric layer disposed on (i) sidewalls of the two adjacent fins, (ii) portions of a top surface of a bottom spacer extending between the at least two adjacent fins, and (iii) portions of a bottom surface of a top spacer extending between the at least two adjacent fins;
       the work function metal layer disposed on interior surfaces of the gate dielectric layer; and
       the gate conductor layer filling a cavity defined by interior surfaces of the work function metal layer.

12. The integrated circuit of claim 11, further comprising:
    the bottom spacer disposed over the top surface of the substrate surrounding at least a portion of the sidewalls of the plurality of fins;

top source/drain regions disposed over top surfaces of the plurality of fins; and
a top spacer surrounding the top source/drain regions.

13. The integrated circuit of claim 12, wherein the gate stack comprises a C-shaped profile adjacent at least one of the plurality of fins at an edge of the semiconductor structure, and further comprising a sidewall spacer disposed over the top surface of the substrate adjacent the edge of the semiconductor structure encapsulating the bottom spacer, the gate stack, and the top spacer.

14. The integrated circuit of claim 13, wherein the C-shaped profile adjacent the at least one fin at the edge of the semiconductor structure comprises:
the gate dielectric layer disposed on: (i) a sidewall of the at least one fin above the bottom spacer; (ii) a top surface of the bottom spacer; and (iii) a bottom surface of the top spacer;
the work function metal layer disposed on the gate dielectric layer; and
the gate conductor layer disposed on the work function metal layer filling a remaining space between the at least one fin and the sidewall spacer.

15. The integrated circuit of claim 11, wherein the gate dielectric layer isolates the gate conductor layer and the work function metal layer from the sidewalls of the plurality of fins, the bottom spacer, and the top spacer.

16. The integrated circuit of claim 11, wherein the box profile in the area between the at least two adjacent fins comprises the gate dielectric layer encapsulating a top, a bottom and sidewalls of the work function metal layer.

17. The integrated circuit of claim 11, wherein the box profile in the area between the at least two adjacent fins comprises the work function metal layer encapsulating a top, a bottom and sidewalls of the gate conductor layer.

18. The integrated circuit of claim 11, wherein the gate stack comprises a C-shaped profile adjacent at least one of the plurality of fins at an edge of the semiconductor structure, and further comprising a sidewall spacer disposed over the top surface of the substrate adjacent the edge of the semiconductor structure encapsulating the bottom spacer, the gate stack, and the top spacer.

19. The integrated circuit of claim 18, wherein the C-shaped profile adjacent the at least one fin at the edge of the semiconductor structure comprises:
the gate dielectric layer disposed on: (i) a sidewall of the at least one fin at the edge of the semiconductor structure above the bottom spacer; (ii) the top surface of the bottom spacer; and (iii) the bottom surface of the top spacer;
the work function metal layer disposed on the gate dielectric layer; and
the gate conductor layer disposed on the work function metal layer filling a remaining space between the sidewall spacer and the work function metal layer.

20. The integrated circuit of claim 11, wherein the gate dielectric layer and the work function metal layer are each formed using a conformal deposition process.

* * * * *